(12) United States Patent
Shizuishi

(10) Patent No.: US 7,880,787 B2
(45) Date of Patent: Feb. 1, 2011

(54) MOS IMAGE SENSOR

(75) Inventor: Makoto Shizuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 1175 days.

(21) Appl. No.: 11/519,087

(22) Filed: Sep. 12, 2006

(65) Prior Publication Data

US 2007/0064133 A1 Mar. 22, 2007

(30) Foreign Application Priority Data

Sep. 14, 2005 (JP) ............ P.2005-267152
Sep. 14, 2005 (JP) ............ P.2005-267153

(51) Int. Cl.
 H04N 5/335 (2006.01)
 H01L 31/062 (2006.01)
 H01L 27/00 (2006.01)

(52) U.S. Cl. .............. 348/308; 348/302; 348/315; 357/290; 357/292; 250/208.1

(58) Field of Classification Search ......... 348/308, 348/294, 302, 310, 303, 311, 315; 257/222, 257/225, 290, 291, 292, 359, 377, 233, 431–466, 257/232; 250/208.1
See application file for complete search history.

(56) References Cited

U.S. PATENT DOCUMENTS

| | | | |
|---|---|---|---|
| 5,719,075 A | 2/1998 | Hawkins et al. | |
| 6,043,478 A * | 3/2000 | Wang | 250/208.1 |
| 6,998,657 B2 * | 2/2006 | Rhodes | 257/222 |
| 2001/0013900 A1 | 8/2001 | Suzuki et al. | |
| 2002/0020845 A1 * | 2/2002 | Ogura et al. | 257/88 |
| 2003/0214595 A1 | 11/2003 | Mabuchi | |
| 2007/0045642 A1 * | 3/2007 | Li | 257/98 |
| 2010/0194943 A1 | 8/2010 | Mabuchi | |
| 2010/0194950 A1 | 8/2010 | Mabuchi | |

FOREIGN PATENT DOCUMENTS

| | | |
|---|---|---|
| JP | 4-31231 B2 | 5/1992 |
| JP | 5-44642 B2 | 7/1993 |
| JP | 9-116136 A | 5/1997 |
| JP | 10-136391 A | 5/1998 |
| JP | 2001-223350 A | 8/2001 |
| JP | 2001-298176 A | 10/2001 |
| JP | 2003-338615 A | 11/2003 |
| JP | 2004-335582 A | 11/2004 |
| JP | 2004-356184 A | 12/2004 |

* cited by examiner

*Primary Examiner*—Lin Ye
*Assistant Examiner*—Marly Camargo
(74) *Attorney, Agent, or Firm*—Birch, Stewart, Kolasch & Birch, LLP.

(57) ABSTRACT

A MOS image sensor comprises: a semiconductor substrate that has a surface including an image area; a plurality of photoelectric conversion elements arranged on the image area; and lines formed over the image area in a manner avoiding the photoelectric conversion elements and connected to a signal-read circuit provided corresponding to each of the photoelectric conversion elements, wherein a predetermined one of the lines is formed by a conductive polysilicon film.

17 Claims, 23 Drawing Sheets

3-Tr STRUCTURE

4-Tr STRUCTURE

MOS IMAGE SENSOR

BACKGROUND OF THE INVENTION

1. Field of the Invention

The present invention relates to MOS image sensors, and more particularly to a MOS image sensor capable of taking an image with quality.

2. Description of the Related Art

FIG. 13A is a typical surface view of a CMOS image sensor arranged with a plurality of photodiodes (photoelectric conversion elements) in a square-lattice form on the surface of a semiconductor substrate in an image area thereof. FIG. 13B is a circuit diagram of the same. In a CMOS image sensor 1 illustrated, a multiplicity of unit pixels 3 are arranged in the image area 2. A control-pulse generating circuit 4 and a vertical scanning circuit 5 are formed laterally of the image area 2 while a noise-suppression circuit 6 and a horizontal; scanning circuit 7 are formed in a lower side region of the image area 2.

The unit pixels in FIG. 13A are designated thereon with R, G, B representing red (R), green (G) and blue (B) filters.

The unit pixel 3 is configured with a photodiode 3a (see FIG. 13B) and a signal-read circuit to read out a signal detected by the photodiode 3a (although FIG. 13B shows a signal-read circuit in the related-art four-transistor structure, there are those of three-transistor structures).

On the image area 2 of the CMOS image sensor 1, there are laid lines 10 extending in an X-direction (horizontal) and lines 11 extending in a Y-direction (vertical). The lines 10 are connected to the control-pulse generating circuit 4 and vertical scanning circuit 5 while the lines 11 are connected to the noise-suppression circuit 6 and horizontal scanning circuit 7.

Those lines 10, 11, laid in X- and Y-directions over the image area 2, are referred to as "global lines" in order to distinguish those, say, from the internal lines of the signal-read circuit or of the control-pulse generating circuit 4, vertical scanning circuit 5, noise-suppression circuit 6 and horizontal scanning circuit 7. The global lines include row-select, row-reset, power and output-signal lines, which are generally formed of metal, such as aluminum or copper.

The related-art CMOS image sensor 1 thus structured can be manufactured by use of the general-purpose CMOS process (DRAM process, etc.) differently from the CCD image sensor using an exclusive manufacturing process, hence being considered low in fabrication cost as compared to the CCD image sensor.

This is because that the CMOS image sensor 1 uses, as its photodiodes 3a, part of MOS transistors (PN junctions) fabricated similarly to other CMOS-LSIs wherein the signal-read circuit for reading a signal out of the photodiode 3a also is configured as a combination of a plurality of MOS transistors.

Meanwhile, out of the photodiodes 3a, a photodiode must be selected to read out a signal. Such selection is made feasible by the global lines 10 connected to the signal-read circuits for the respective photodiodes, similarly to the memory selection in the DRAM.

FIG. 14A is a schematic perspective view of the CMOS image sensor in a part covering one unit pixel. FIG. 14A is a typical sectional view of the same.

Visible rays of light 15 externally enter through a microlens (top lens) 16, color filter layer 17, etc. arranged corresponding to the pixel, on a unit-pixel-by-unit-pixel basis, which light arrives at the photodiode 3a.

On this occasion, the global lines 10, 11 act to block part of the incident light. Part of incident light is multi-reflected at between the global lines 10, 11 or with a metal thin film (shade film, usually an aluminum film) shading the area of the signal-read circuit 18 (see FIG. 14A), etc. except for the photodiode 3a. The multi-reflection light 20, if leaks into the adjacent photodiode 3a, raises a problem of the image-quality deterioration in a pickup image. The photodiode 3a, formed on the semiconductor substrate, is isolated by the device-isolation region 21 from the MOS transistor constituting a signal-read circuit for selecting and amplifying the signal. In the CMOS process, a gate electrode 22, constituting the MOS transistor, is formed between the device-isolation regions 21, over which a planarization protection film 23 is formed. Thereafter, the first wiring layer is formed of metal, e.g. aluminum.

Provided that the first interconnect layer is a global line 10 extending in an X-direction, there is a need to further form a planarized insulation film over the X-directional global line 10 such that the Y-directional global line 11 crosses with the global line 10 in a manner not to cause an electric short to each other, on which the Y-directional global line 11 is formed.

Usually, a planarization film is further overlaid to form a shade film 19. Furthermore, a planarization film is overlaid to form a color-filter layer 17 thereon. In this manner, in the CMOS process, the global line is usually formed in a multi-level structure.

It is the related-art practice to use a low-resistance metal material, such as Al (aluminum), in order to assure the high-speed operation of the integrated circuit (IC). However, because aluminum has a high on-surface reflectivity, it is difficult to avoid the problem of multi-reflection noted above.

Incidentally, the prior arts concerning CMOS image sensors include, say, a description in JP-A-2001-298176.

Image sensors include those having photodiodes in a matrix arrangement wherein the photodiodes on the even row are arranged deviated a half pitch relative to the photodiodes on the odd row as described in the below JP-A-10-136391, besides the image sensors arranged with photodiodes in a square lattice form on the image area. This arrangement, i.e. so-called honeycomb arrangement, has already been realized on the CCD image sensor wherein the vertical transfer line, provided between horizontally (X-directionally) adjacent photodiodes, is formed horizontally (Y-directionally) and zigzag.

There is a desire for realizing a MOS image sensor having photodiodes in a honeycomb arrangement. There are proposals on those described in the below JP-A-5-44642 and JP-A-4-31231. In this case, the global lines 10, 11 also must be formed zigzag in a manner avoiding the photodiodes, similarly to the zigzag vertical transfer line on the CCD image sensor. This increases the length of the line and hence the resistance-through-the-line. Besides, there is a need to resolve the problem of image-quality deterioration due to multi-reflection noted before.

The MOS image sensor is formed with a multi-level structure of wiring layers over a semiconductor substrate formed with photodiodes and signal-read circuits, over which an optical layer, such as of a color filter and a microlens, are formed structurally. Along with the recent advancement of micro-fabrication technology, the number (density) of pixels increases for the image sensor, resulting in the tendency toward decreasing the opening dimension of one pixel and the distance to the adjacent pixel. However, there is no advancement of miniaturization in the height direction. In each pixel, the optical path is becoming narrower for the incident light traveling from the microlens to the photodiode. Thus, as the number of pixels increases for the image sensor, there is an increasing effect of multi-reflection that is not to be ignored.

Where providing photodiodes in a honeycomb arrangement for the MOS image sensor, the global lines must be devised for taking a quality image while preventing the multi-reflection of incident light. Meanwhile, attentions must be paid not to cause a trouble in reading a signal or supplying power through the global lines.

SUMMARY OF THE INVENTION

It is an object of the present invention to provide a MOS image sensor capable of taking an image with quality while preventing incident light from multi-reflecting upon global lines, and a manufacturing method for same.

According to the invention, there is provided a MOS image sensor comprising: a semiconductor substrate that has a surface including an image area; a plurality of photoelectric conversion elements arranged on the image area; and lines formed over the image area in a manner avoiding the photoelectric conversion elements and connected to a signal-read circuit provided corresponding to each of the photoelectric conversion elements, wherein a predetermined one of the lines is formed by a conductive polysilicon film.

According to the invention, there is provided the MOS image sensor, wherein the predetermined line is a control signal line.

According to the invention, there is provided the MOS image sensor, wherein the control signal line comprises reset and row-select lines for the signal-read circuit in a three-transistor structure, and comprises reset, row-select and row-read lines for the signal-read circuit in a four-transistor structure.

According to the invention, there is provided the MOS image sensor, wherein, other lines than the predetermined line comprise power and output-signal lines each formed by a metal line.

According to the invention, there is provided the MOS image sensor, wherein a surface of the metal line is coated with a low-reflective material.

According to the invention, there is provided the MOS image sensor, wherein the low-reflective material includes at least one of polysilicon, silicon nitride, tungsten, alumina, color resist, surface-scatter porous material and light-absorbing material.

According to the invention, there is provided the MOS image sensor, wherein, when the predetermined line is formed in plurality and adjacent one to another, interlayer insulation between the lines is provided by an oxide film formed on a surface of the conductive polysilicon film.

According to the invention, there is provided the MOS image sensor, wherein the predetermined line is formed on a device-isolation region that isolates between the photoelectric conversion elements.

According to the invention, there is provided the MOS image sensor, wherein the signal-read circuit is configured with a MOS transistor having a gate electrode formed integral with the predetermined line.

According to the invention, there is provided the MOS image sensor, wherein said plurality of photoelectric conversion elements are arranged in a square lattice form.

According to the invention, there is provided the MOS image sensor, wherein said plurality of photoelectric conversion elements are arranged in a matrix form, and those of the photoelectric conversion elements on an odd row are deviated a half pitch relative to those of the photoelectric conversion element on an even row.

According to the invention, there is provided the MOS image sensor, wherein the lines are formed horizontally or vertically so as to zigzag in a manner avoiding the photoelectric conversion elements, and the lines are formed equal in pitch in a part of the lines connected to a required circuit provided in a periphery of the image area.

According to the invention, there is provided a MOS image sensor comprising: a semiconductor substrate that has a surface including an image area; a plurality of photoelectric conversion elements arranged on the image area; and lines formed over the image area in a manner avoiding the photoelectric conversion element and connected to a signal-read circuit provided corresponding to each of the photoelectric conversion elements, wherein a predetermined one of the lines is formed by silicide or salicide.

According to the invention, there is provided a manufacturing method for the MOS image sensor above, comprising: forming a first conductive polysilicon film in a first level; patterning the first conductive polysilicon film into a wiring form; forming an insulation film on a surface of the first conductive polysilicon film patterned in a wiring form; forming a second conductive polysilicon film in a second level over the insulation film; and patterning the second conductive polysilicon film into a wiring form, so as to form a plurality of the predetermined lines adjacent one to another.

According to the invention, there is provided the manufacturing method, wherein the second conductive polysilicon film formed is planarized by CMP in a portion overlapping with the first conductive polysilicon film when viewed from a normal direction of the semiconductor substrate, and then the second conductive polysilicon film is patterned.

According to the invention, there is provided a manufacturing method for the MOS image sensor above, comprising: forming a first silicide or salicide film in a first level; patterning the first silicide or salicide film into a wiring form; forming an insulation film on a surface of the first silicide or salicide film patterned in a wiring form; forming a second silicide or salicide film in a second level over the insulation film; and patterning the second silicide or salicide film into a wiring form, so as to form a plurality of the predetermined lines adjacent one to another.

According to the invention, there is provided a digital camera comprising the MOS image sensor above.

According to the invention, because a predetermined line is formed of conductive polysilicon (or silicide or salicide) lower in reflectivity than the metal film, it is possible to suppress the multi-reflection of stray portion of incident light and to take an image with quality. Besides, in the case where the pixels (photoelectric conversion elements) are so-called in a honeycomb arrangement, by complementing an image signal generated by using horizontally-adjacent two pixels as intermediate-position information (referred to as honeycomb signal processing), resolution is improved horizontally thus making it possible to place the characteristic approximate to the human visual perceptibility. Furthermore, because a predetermined line can be formed directly (not through a planarization film) on an insulation layer formed over a semiconductor surface, the structure formed over the semiconductor substrate can be reduced in thickness, thus reducing the distance between the microlens (top lens) and the image area.

DETAILED DESCRIPTION OF THE INVENTION

Embodiments of the present invention will now be explained with reference to the drawings.

Figure 1:
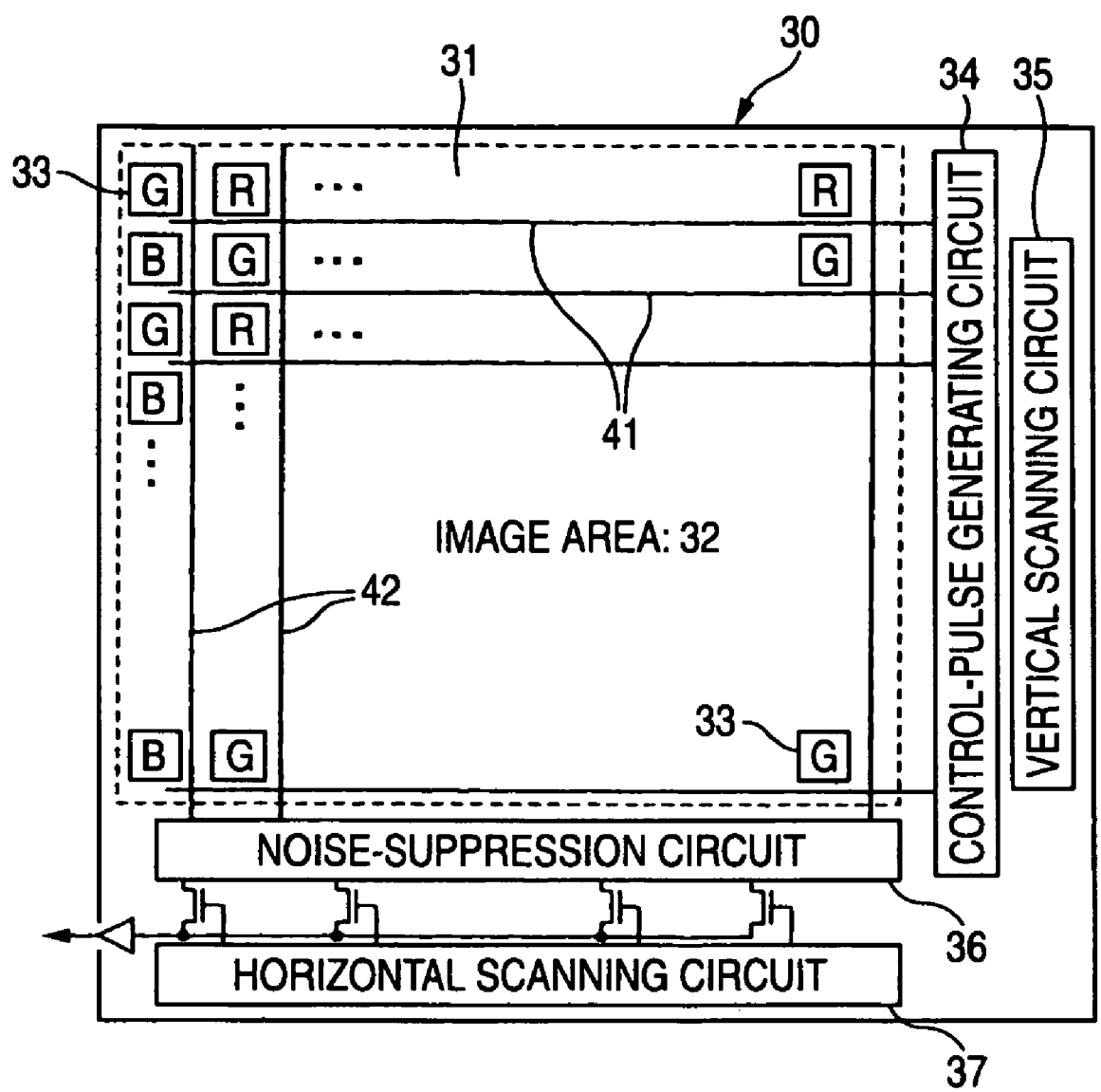
FIG. 1 is a typical surface view of a MOS image sensor according to the first embodiment of the present invention.

FIG. 1 is a typical surface view of a MOS image sensor 30, to be mounted on a digital camera, according to a first embodiment of the present invention. There are arranged a plurality of unit pixels 33 in a square lattice arrangement on a surface of a semiconductor substrate 31 in an image area thereof. A control-pulse generating circuit 34 and a vertical scanning circuit 35 are formed laterally of the image area 32 while a noise-suppression circuit 36 and a horizontal scanning circuit 37 are formed in a lower side region of the image area 32.

On the image area 32 of the MOS image sensor 30, there are laid global lines 41 extending in an X direction and global lines 42 extending in a Y direction. The global lines 41 are connected to the control-pulse generating circuit 34 and vertical scanning circuit 35 while the global lines 42 are to the noise-suppression circuit 36, horizontal scanning circuit 37 and power source. The global lines 41, 42 are laid in positions avoiding the photodiodes 33a (see FIGS. 2A and 2B) constituting the unit pixels 33 arranged in a square lattice form.

Figure 2A:
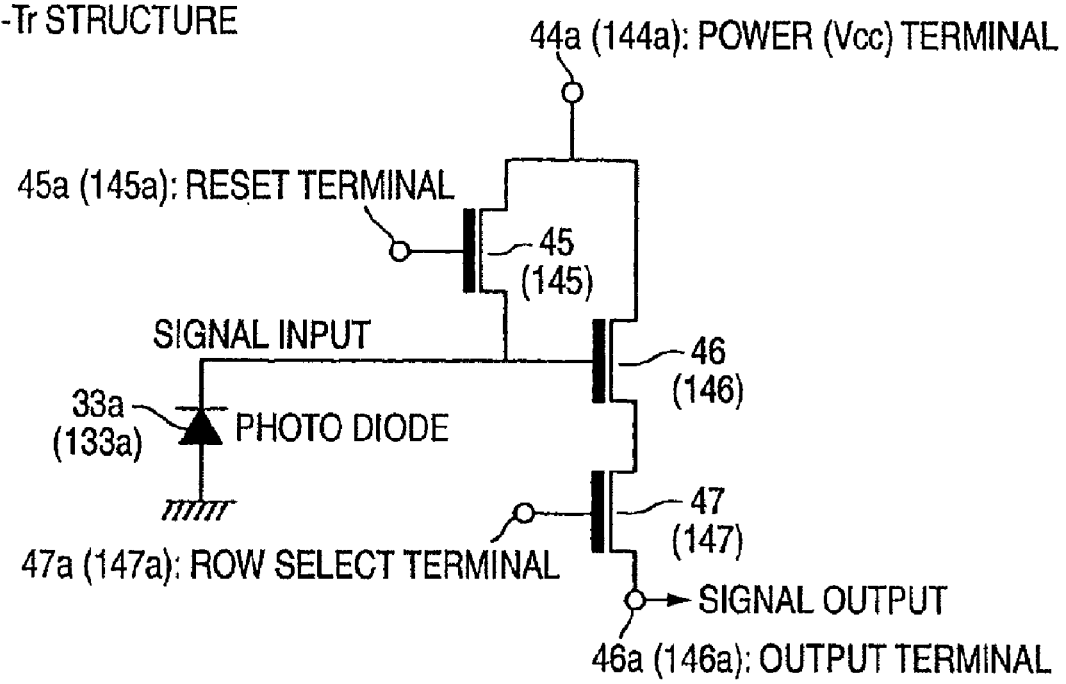
FIG. 2A is a circuit diagram of a signal-read circuit in the related-art three-transistor structure provided nearby a photodiode shown in FIG. 1.
Figure 2B:
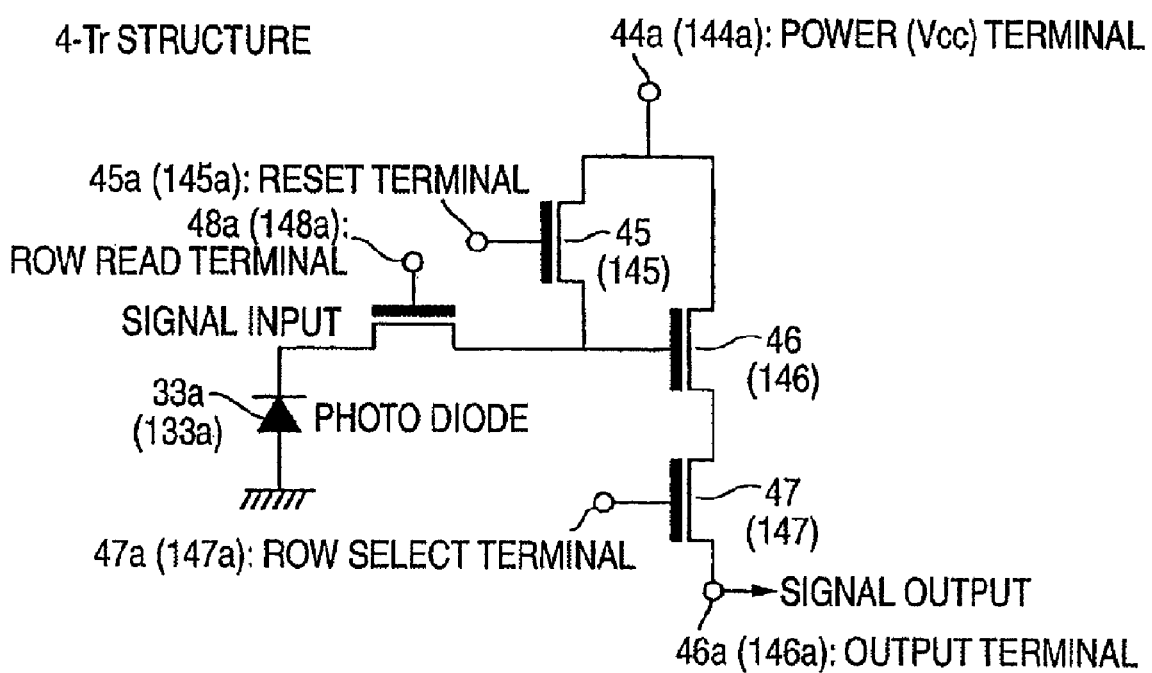
FIG. 2B is a circuit diagram of a signal-read circuit in the related-art four-transistor structure provided nearby a photodiode shown in FIG. 1.

FIGS. 2A and 2B show circuit diagrams of the photodiode 33a and the signal-read circuit provided in the vicinity thereof. FIG. 2A is a signal-read circuit diagram in the related-art three-transistor structure while FIG. 2B is a signal-read circuit diagram in the related-art four-transistor structure.

In the case of the three-transistor structure, there are a power terminal 44a to supply power voltage Vcc, a reset terminal 45a to apply a reset signal to the gate of a reset transistor 45, an output terminal 46a to output a signal from an output transistor 46, and a row-select terminal 47a to apply a row-select signal to the gate of a row-select transistor 47. In the case of the four-transistor structure, there is included a row-read terminal 48a to apply a row-read signal to the gate of a row-read transistor 48 in addition to the terminals 44a, 45a, 46a, 47a of the three-transistor structure.

In order to connect the terminals 44a, 45a, 46a, 47a, 48a to the power source, horizontal scanning circuit 37 and vertical scanning circuit 35, the global lines 41, 42 are laid over the image area 32 of the semiconductor substrate.

Accordingly, although FIG. 1 shows merely respective ones of the horizontal and vertical global lines 41, 42 laid between adjacent unit pixels 33, there is actually a need to lay two or three global lines between the adjacent unit pixels 33.

Of the global lines, the power line connected to the power terminal 44a preferably uses a line having a low electric resistance, in view of stable supply of power voltage Vcc to the signal-read circuit. Meanwhile, the output signal line connected to the output terminal 46a also preferably uses a line having a low electric resistance because to pass an analog output signal.

On the contrary, concerning the control signal lines connected to the gate electrode of the MOS transistor constituting the signal-read circuit, e.g. a reset line connected to the reset terminal 45a, a row-select line connected to the row-select terminal 47a and a row-read line connected to the row-read terminal 48a, it is satisfactory to apply on-off signals (0, 1 signals) so that the relevant transistor can turn on and off. The global lines can be set with respective electric resistances in a range the transistor's switch rate is obtained to meet the requirement.

The DRAM or the like essentially requires a low-resistance line because the read rate out of the memory is on the order of ns. However, the image sensor has a read rate on the order of μs and hence can use a line higher in electric resistance as compared to the DRAM. Namely, the signal lines for controlling the image sensor, e.g. the reset line, the row-select line and the row-read line, have a greater margin in respect of permissible specific resistance per unit length, as compared to the DRAM case.

For this reason, in the present embodiment, the control signal line is formed of conductive polysilicon film instead of metal while the power and output-signal lines are of metal, such as of aluminum or copper, similarly to the related-art.

Figure 3A:
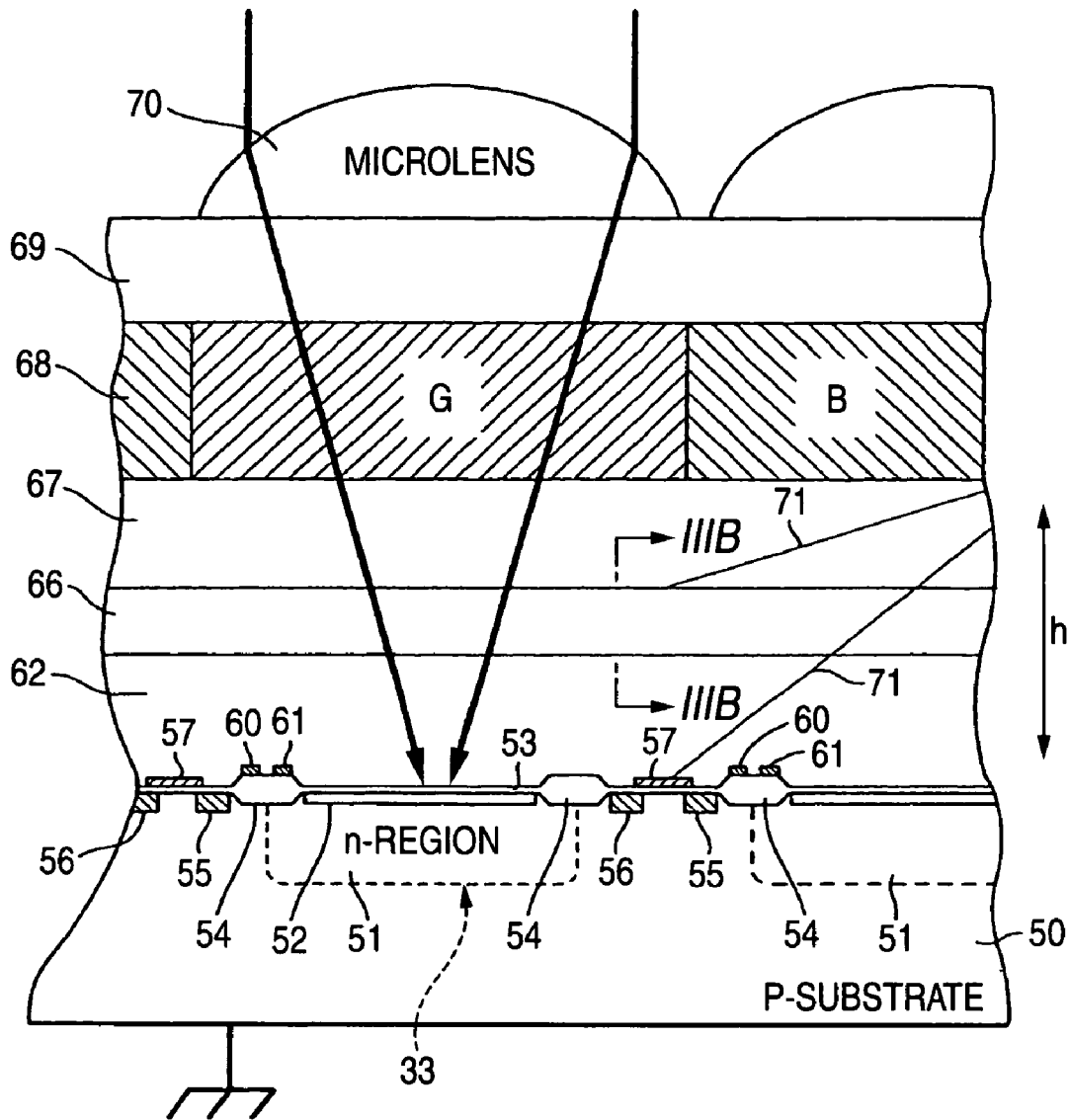
FIG. 3A is a typical sectional view of the MOS image sensor shown in FIG. 1, in a part covering nearly two pixels.
Figure 3B:
FIG. 3B is a typical sectional view taken along line IIIB-IIIB in FIG. 3A.

FIG. 3A is a typical sectional view showing the MOS image sensor shown in FIG. 1, in a part covering nearly two photodiodes 33a thereof. FIG. 3B is a typical sectional view taken along line IIIB-IIIB in FIG. 3A. In the MOS image sensor of this embodiment, a photodiode 33a is formed by forming an n-region 51 in a surface of a P-type semiconductor substrate 50. In a surface of the n-region 51, a surface P+ layer 52 is formed which is effective in reducing so-called "white injury" appearing on the image screen while an oxide film 53 is formed in the extreme surface.

A device-isolation region 54 is formed by forming thick an oxide film 53 in a portion defining between the photodiode 33a (51) and the signal-read-circuit formed region. Between adjacent ones of the device-isolation regions 54, formed are a source 55, a drain 56 and a gate electrode 57 for a MOS transistor constituting a signal-read circuit. There are various methods for forming a device-isolation region 54, i.e. LOCOS or recess-LOCOS technique, trench isolation (STI), high-concentration-boron-ion implant technique are usable.

Note that FIGS. 3A and 3b are mere typical views merely depicting that the MOS transistor is formed in that site, i.e. the source, the drain and the gate are not correctly shown in arrangement position for the MOS transistor.

In this embodiment, conductive polysilicon films 60, 61 are laid on a surface of the device-isolation region 54, to provide two global lines. The conductive polysilicon films 60, 61 are respectively used as a rest line and a row-select line, say, for a three-transistor structure (FIG. 2A).

A gate electrode 57 and a conductive polysilicon film 60, 61 are respectively formed on the oxide film 53 and the device-isolation region 54, over which an interlayer insulation film 62 is formed and then planarized, to form thereon global lines 63, 64 (FIG. 3B) of metal, e.g. aluminum or the like. The metal lines 63, 64 are respectively used, say, as power and output-signal lines for a three-transistor structure.

After forming the metal lines 63, 64, a surface anti-reflection film 66 is formed covering the metal lines 63, 64. The surface anti-reflection film 66 is formed of light-absorbing-color resist, for example.

Furthermore, an interlayer insulation film 67 is formed over the surface anti-reflection film 66 and then planarized, on which a color-filter layer 68 is formed to form thereon a microlens 70.

Figure 14A:
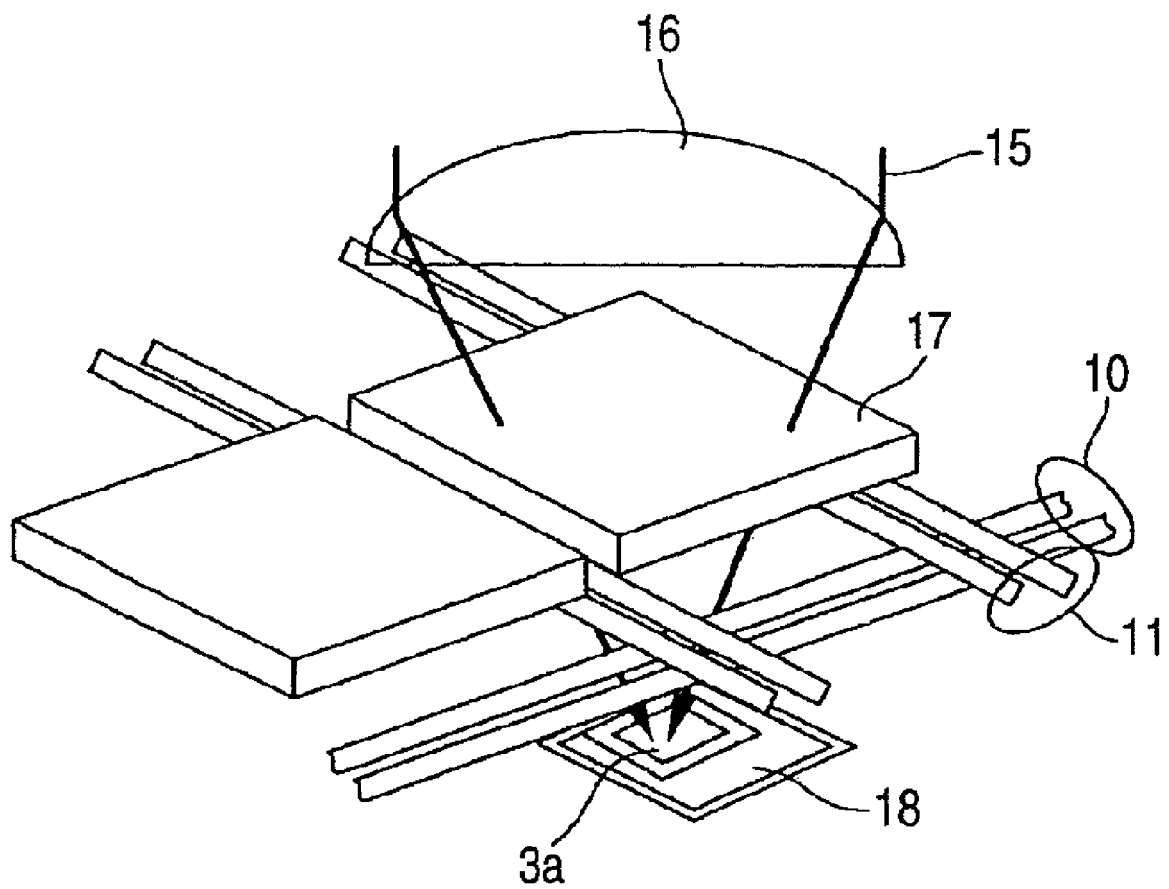
FIG. 14A is an essential-part perspective view of one pixel shown in FIG. 13.
Figure 14B:
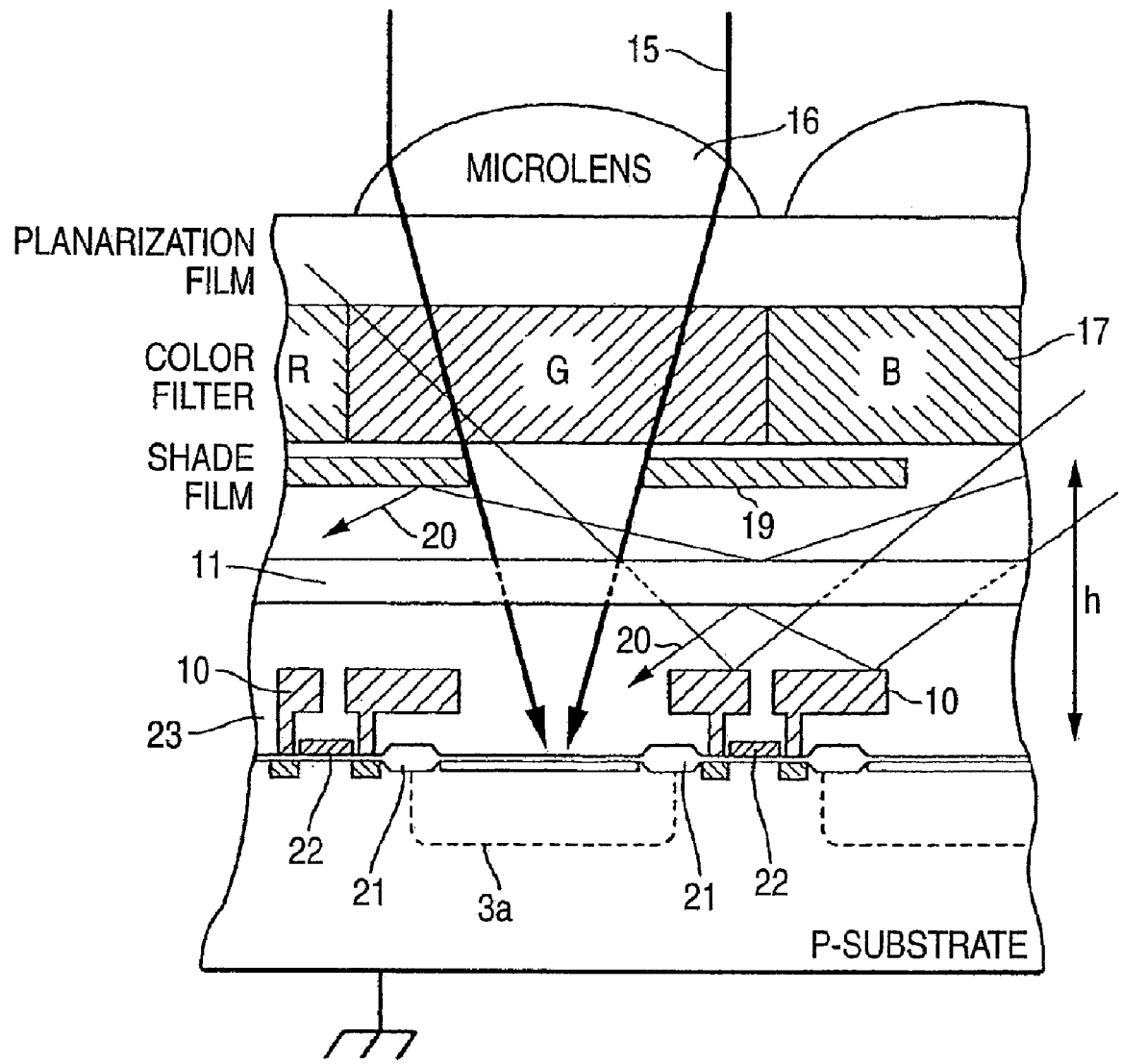
FIG. 14B is a typical sectional view of the one pixel shown in FIG. 13.

Comparing with the related-art structure in FIG. 14B, the present embodiment is eliminated of the necessity for the interlayer insulation film 23 and metal layer 10 provided over the gate electrode 22, thus being reduced in thickness h correspondingly.

In this manner, the present embodiment uses, for global lines, conductive polysilicon lower in reflectivity than metal wherein the metal lines are covered with a low-reflective light-absorbing material, thus reducing the stray portion 71 of incident light. Moreover, because the multi-level structure formed on the semiconductor substrate 50 can be reduced in thickness h, the color filter 68 and the microlens 70 can be provided closer to the image area (photodiode), thus facilitating focus control in forming the microlens 70. Thus, the MOS image sensor in this embodiment is allowed to take an image with quality.

Figure 4A:
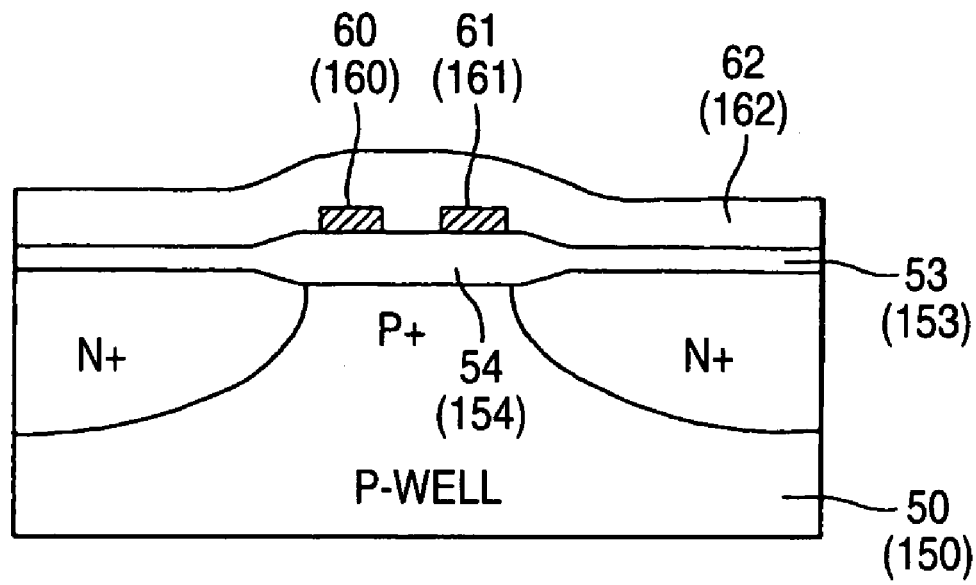
FIG. 4A is a typical sectional view of global lines formed of low-reflectivity, conductive polysilicon on a device-isolation region shown in FIG. 2A, showing two global lines.

FIG. 4A is a magnification view in a part of the global lines 60, 61 formed of low-reflective conductive polysilicon shown in FIG. 3A. A gate oxide film 53 is formed in an extreme surface of a semiconductor substrate 50 while a device-isolation region 54 is formed by increasing the thickness of the oxide film. On the device-isolation region 54, global lines 60, 61 are formed two in the illustrated example, on which a planarization film 62 is formed.

Figure 4B:
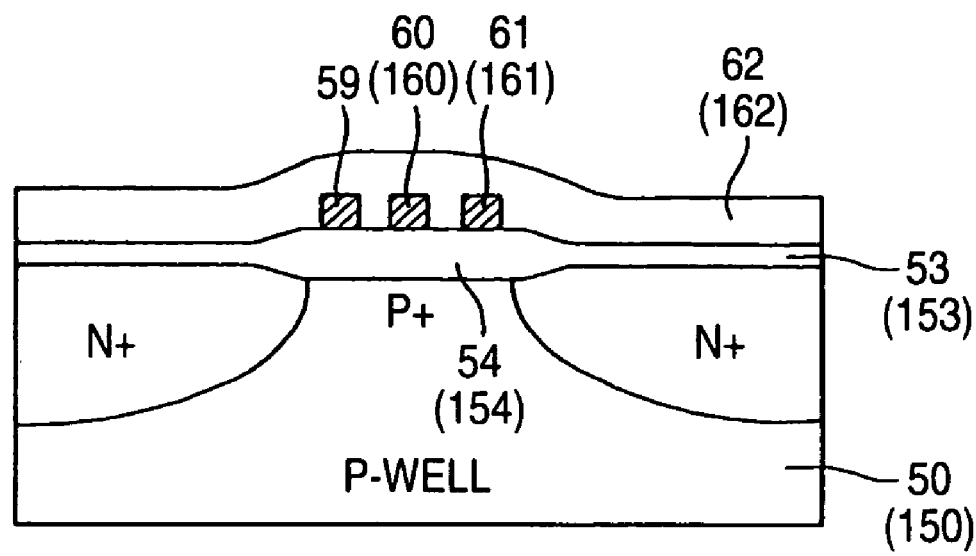
FIG. 4B is a typical sectional view of global lines formed of low-reflectivity, conductive polysilicon on a device-isolation region shown in FIG. 2A, showing three global lines.

FIG. 4B is a view showing an example that three global lines 59, 60, 61 are formed on the device-isolation region 54. As explained in FIG. 2B, the signal-read circuit of a 4-transistor structure requires three control signal lines (a reset signal line, a row-select line, a row-read line) wherein those three are formed on the device-isolation region 54. Because the global lines 59, 60, 61 in this embodiment are formed by using conductive polysilicon, three global lines can be formed even on a device-isolation region 54 narrow in area because of the reason referred later.

Figure 5A:
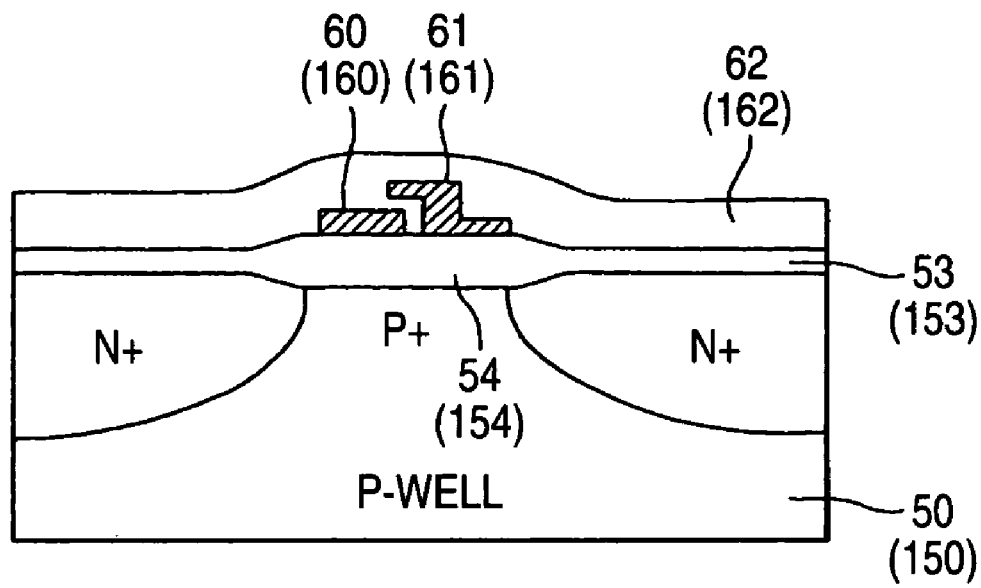
FIG. 5A is a typical sectional view of global lines in a two-level structure formed of low-reflectivity, conductive polysilicon on a device-isolation region shown in FIG. 2A, showing two global lines.

FIG. 5A is a view showing an embodiment that a two-level structure of conductive polysilicon is applied to a MOS image sensor. A low-reflective conductive polysilicon layer is formed in a first level and patterned into a desired form by a photolithography process, thus forming a global line 60. Thereafter, thermal oxidation is made on the surface of the global line 60 to thereby form an oxide film ($SiO_2$), on which a low-reflective conductive polysilicon layer is formed in a second level. This polysilicon layer is patterned into a desired form by a photolithography process, to form a global line 61.

Figure 5B:
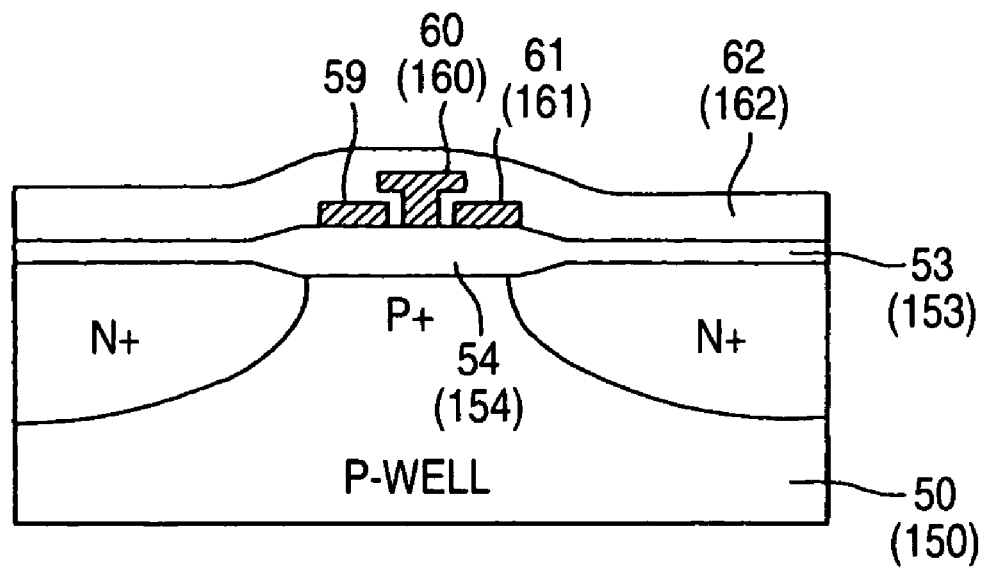
FIG. 5B is a typical sectional view of global lines in a two-level structure formed of low-reflectivity, conductive polysilicon on a device-isolation region shown in FIG. 2A, showing three global lines.

FIG. 5B is a view showing an example that three global lines 59, 60, 61 are formed by the two levels of conductive polysilicon. A low-reflective conductive polysilicon film in the first level is patterned into global lines 59, 61 while a low-reflective conductive polysilicon film in the second level is patterned into a global line 60.

Figure 6A:
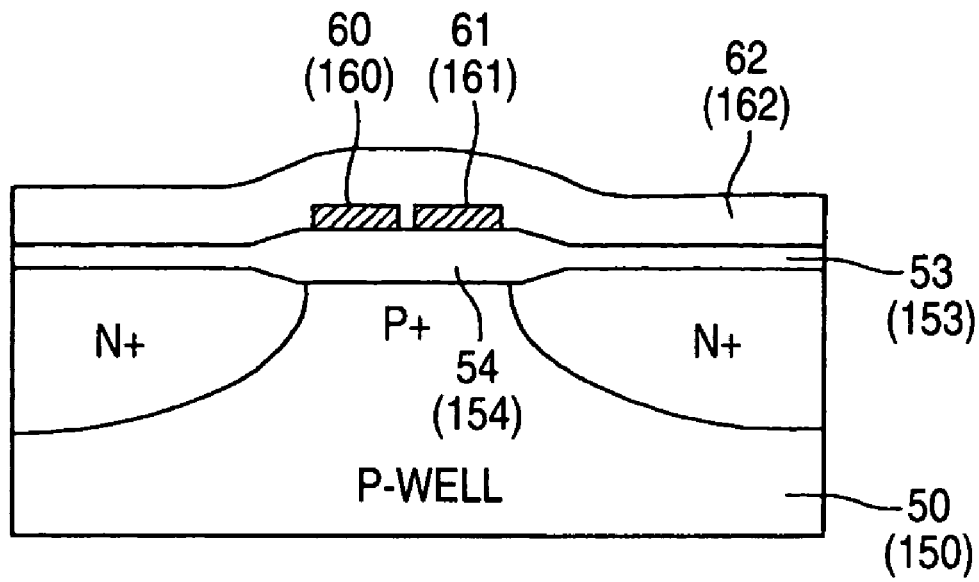
FIGS. 6A and 6B are views showing an example that the global lines respectively shown in FIGS. 5A and 5B are planarized by CMP.
Figure 6B:
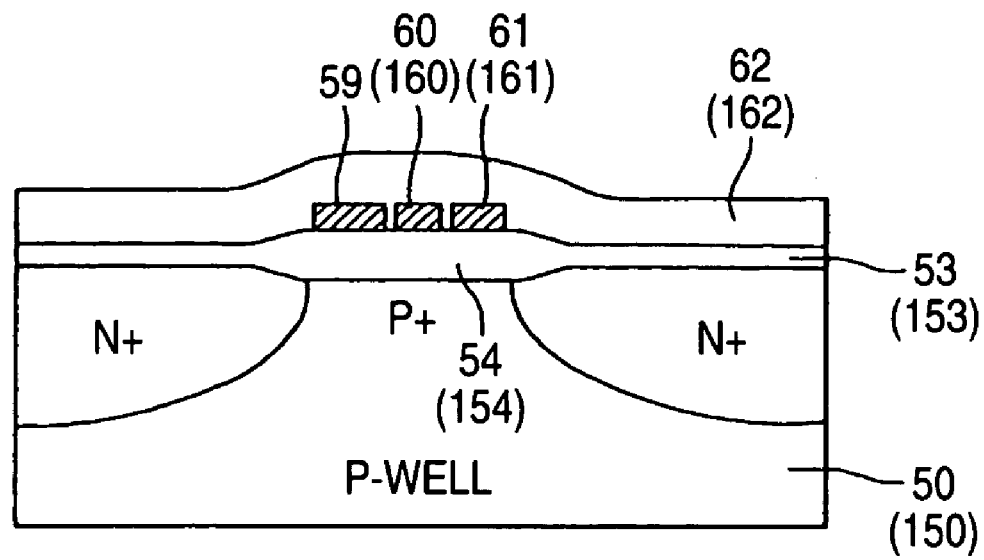

FIGS. 6A and 6B are views showing embodiments that the global lines shown in FIGS. 5A and 5B are improved. Of the global lines shown in FIGS. 5A and 5B, the second-level global line has an end overlapping with the first-level global line and hence provided higher at the overlap. Accordingly, in the embodiment shown in FIGS. 6A and 6B, the overlap portion of in the second-level global line is planarized by a chemical-mechanical polishing (CMP) process thereby simplifying two or three global lines and forming a planarization film 62 thereon.

This can reduce the height (thickness) of the global line and subsequently form color-filter and microlens layers with accuracy. Moreover, the microlens can be provided closer to the image area. Meanwhile, there is an advantage that, when forming a microlens, focus control of a microlens is easier in an amount closer of the microlens to the image area.

Figure 7:
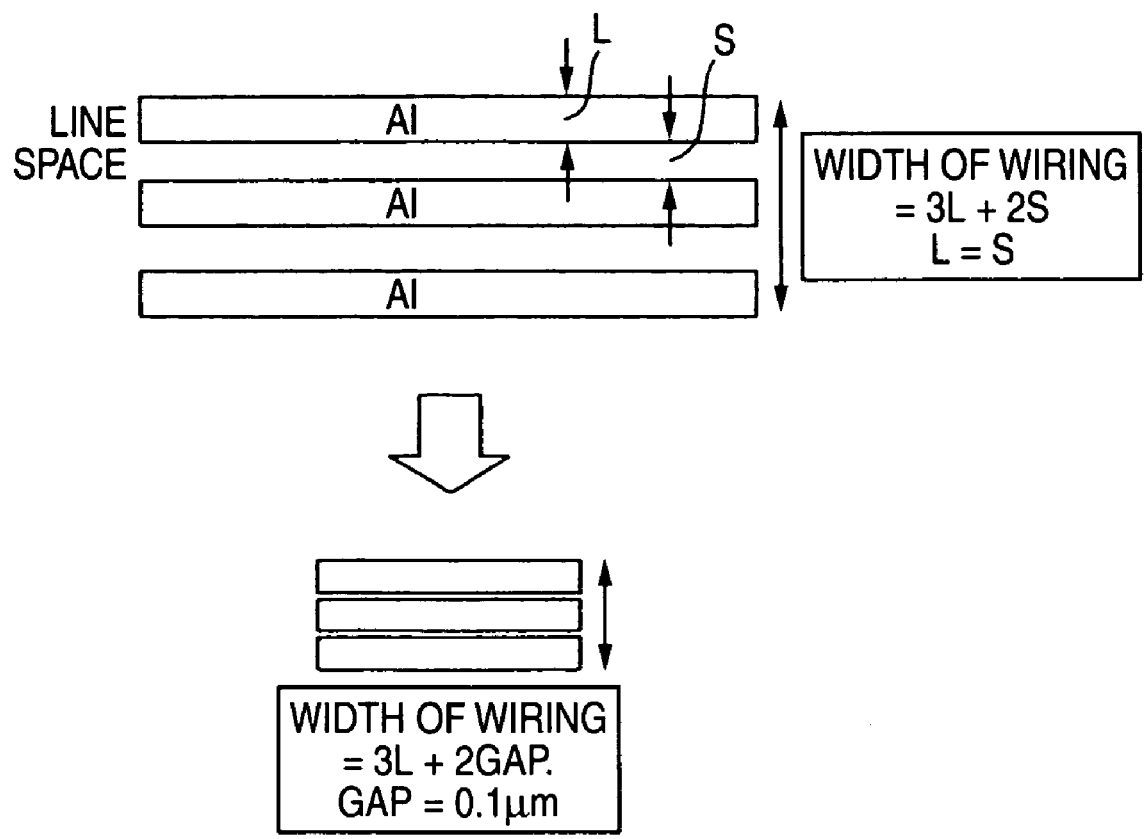
FIG. 7 is a figure illustrating an advantage obtainable where global lines are formed of conductive polysilicon in contrast to forming global lines of metal.

FIG. 7 is a figure explaining an advantage that global lines are formed of polysilicon as compared to the case forming those of metal. Where three global lines are formed of metal, e.g. aluminum, on a narrow device-isolation region 54, an aluminum film is patterned into three global lines by photolithography and the subsequent etching.

In this case, the line width L of fine aluminum lines and the spacing S between the aluminum lines are equal under the design rule for manufacture. Namely, L=S results wherein the three aluminum lines have the overall width given as 3L+2S.

On the contrary, where forming three global lines by using conductive polysilicon, it is possible to use a highly-insulative oxide film, obtained by thermally oxidizing the surface of a first-level global line, as an insulation space of between the global lines. The space (gap) has satisfactorily a width of 200 to 1500 angstroms.

Figure 8A:
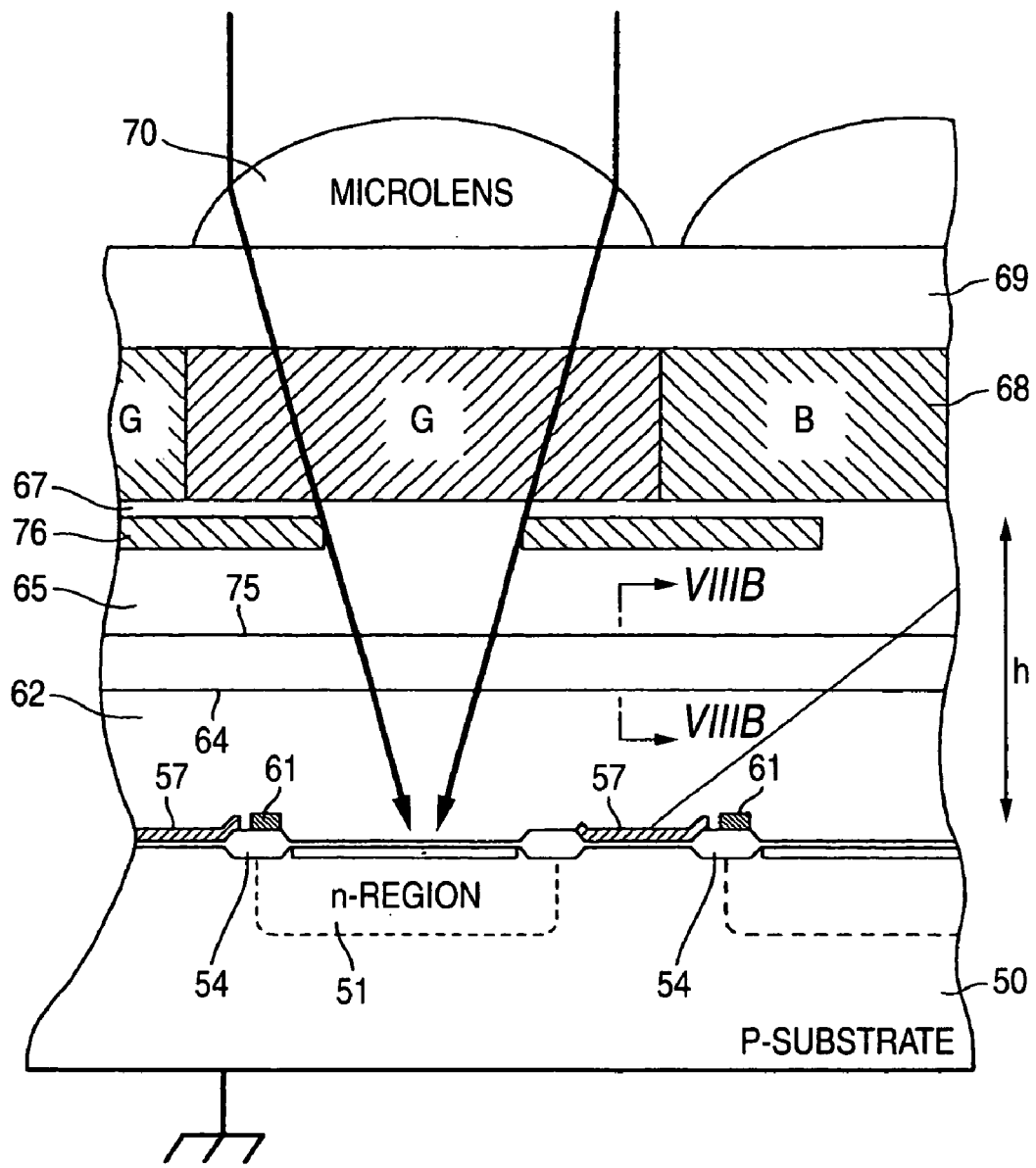
FIG. 8 is a typical sectional view of a MOS image sensor according to another embodiment of the invention.
Figure 8B:

FIG. 8A is a typical sectional view of a MOS image sensor according to a second embodiment, in a region covering two photodiodes thereof. FIG. 8B is a typical sectional view taken along line VIIIB-VIIIB in FIG. 8A. The FIG. 3 embodiment covered the metal line 63, 64 with the surface anti-reflection film 66 serving also as a shade film. However, in this embodiment, the metal lines 63, 64 at respective surfaces are covered with coat films 75, over which a planarization layer 65 is formed. On the planarization layer 65, a shade film 76 is provided of metal, on which a planarization layer 67 is formed to form a color-filter layer 68 thereon.

The coat film 75 is formed of a low-reflective material, such as polysilicon, silicon nitride, tungsten or alumina, a color-filter material, a surface-scatter porous material, or a light-absorbing material such as carbon black, thus providing a structure preventing against multi-reflection upon the metal line 63, 64.

Figure 9A:
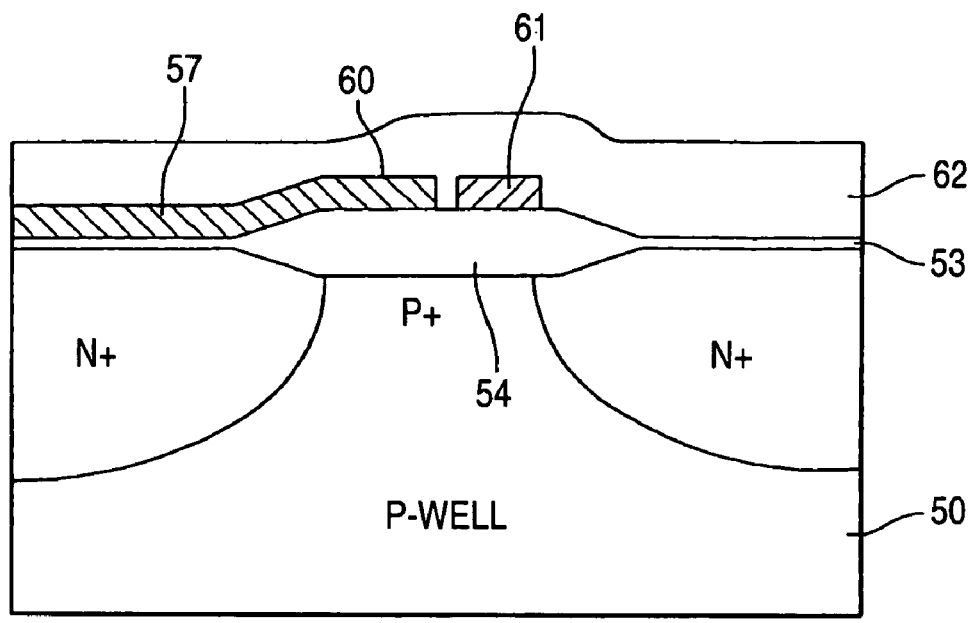
FIG. 9A is an essential-part magnification view of FIG. 8A

Incidentally, FIG. 8A shows a section where the global line 60 formed on the device-isolation region 54 is formed continuous with the gate electrode 57 while FIG. 9A is an essential-part magnification view of FIG. 8A.

Figure 9B:
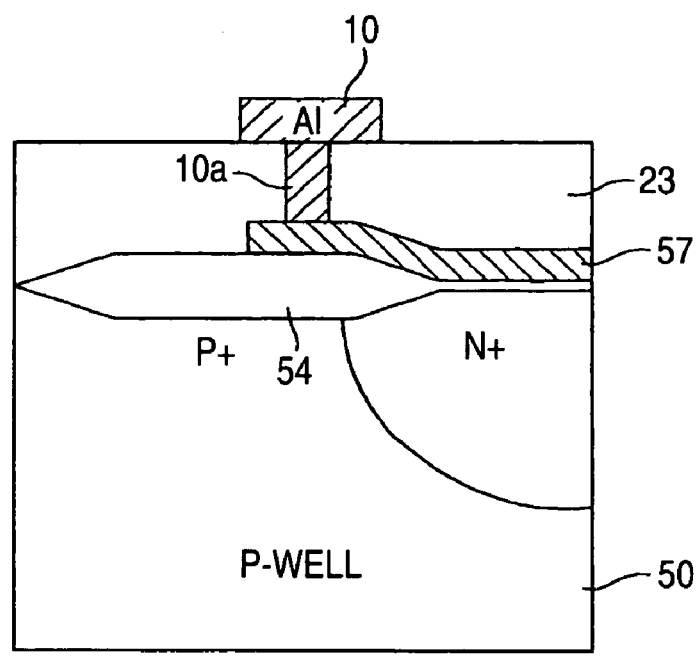
FIG. 9B is a typical sectional view of the related-art one for comparison with FIG. 9A.

In the related art, there is a need to connect between the gate electrode 57 with an aluminum line 10 laid in the higher level through a contact hole 100a as shown in FIG. 9B, which requires the increased number of manufacturing process steps. However, in case a global line 61 is formed by using a conductive polysilicon film as in the embodiment, there is obtained an advantage that the polysilicon film can be formed integral with the gate electrode 57 to be connected therewith. Meanwhile, although the provision of a contact hole 10a could not have been in the image area, the present embodiment is allowed to broaden the image area owing to the uselessness of a contact hole 10a.

Figure 10:
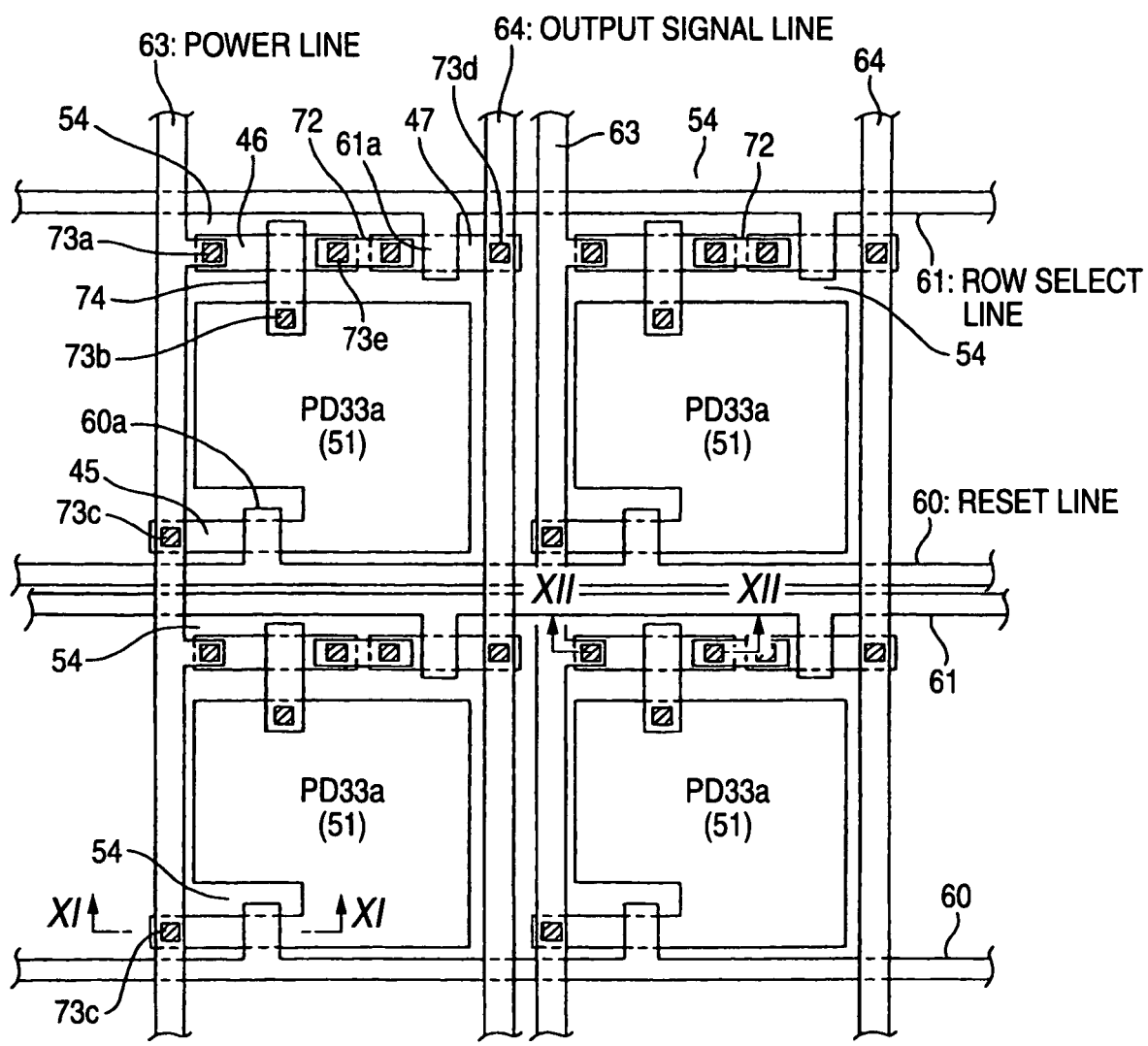
FIG. 10 is a wiring diagram showing a detail of the global lines on the MOS image sensor shown in FIG. 1, in a part covering four photodiodes (image area)

FIG. 10 is a wiring diagram showing a detail of the FIG. 1 MOS image sensor (image area) in a part around four photodiodes thereof. The photodiodes 33a (n-region 51 in FIG. 3A) are respectively provided with signal-read circuits each in a three-transistor structure shown in FIG. 2A.

Namely, a source and a drain are formed for output and row-select transistors 46, 47, in a region along the upper side of each of the photodiodes (PD) 33a. Connection is provided between the drain of the output transistor 46 and the source of the row-select transistor 47 by a metal line 72. Meanwhile, for the reset transistor 45, a source and a drain are formed in a lower left corner of each of the photodiodes 33a. The drain of the reset transistor 45 is formed continuous with the n-region (51) of the photo-transistor 33a.

The photodiodes 33a or the signal-read-circuit regions are defined by the device-isolation region 54. On the device-isolation region 54 extending horizontally between the photodiodes 33a, reset and row-select lines 60, 61 of conductive polysilicon are laid as global lines. Meanwhile, power and output-signal lines 63, 64 of metal are laid between the photodiodes 33a extending in the vertical orthogonal to the global lines 60, 61, through the planarization film 62 (see FIG. 3B) relative to the reset and row-select lines 60, 61.

The source terminal of the output transistor 46 is connected to the power line 63 through a via-contact 73a. The gate of the output transistor 46 is connected to the photodiode 33a through a conductive polysilicon line 74 and via-contact 73b.

Connection is provided between the source terminal of the reset transistor 45 and the power line 63 through a via-contact 73c. The gate terminal of the reset transistor 45 is connected to a conductive polysilicon terminal 60a formed extending from the reset line 60.

The row-select transistor 47 has a gate terminal formed with a conductive polysilicon terminal 61a extending from the row-select line 61, whose drain, i.e. output terminal 46a shown in FIG. 2A, is connected to the output signal line 64 through a via-contact 73d.

Figure 11:
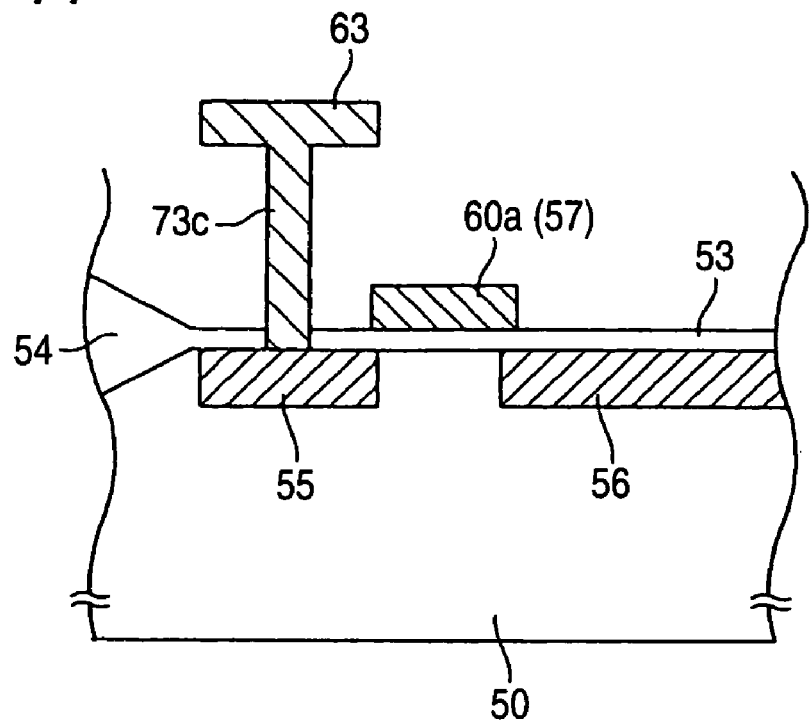
FIG. 11 is a typical sectional view of a reset transistor taken along line XI-XI in FIG. 10.

FIG. 11 is a typical sectional view of the reset transistor 45 taken along line XI-XI in FIG. 10. The reset transistor 45 has a source 55 and a drain 56 (the drain 56 is continuous with the n-region 51 of the photodiode) that are formed isolated in the surface of the p-type substrate 50, on which the oxide film 53 is formed. On the oxide film 53, the conductive polysilicon terminal 60a is formed which is provided as a gate terminal (reference numeral 57 in FIGS. 3A and 8A) of the reset transistor 45. Meanwhile, connection is provided between the metal line 63 and the source 55 through the via-contact 73c.

Figure 12:
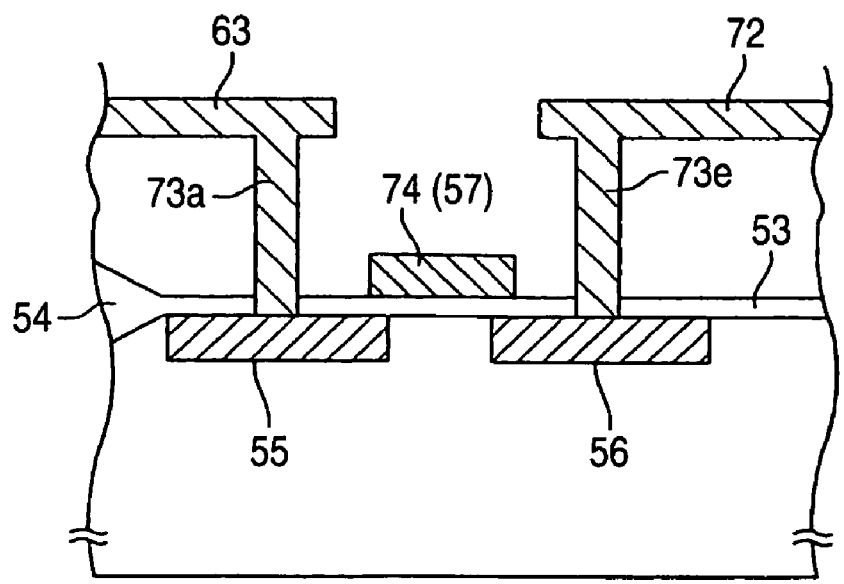
FIG. 12 is a typical sectional view of an output transistor taken along line XII-XII in FIG. 10.

FIG. 12 is a typical sectional view of the output transistor 46 taken along line XII-XII in FIG. 10. For the output transistor 46 has a source 55 and a drain 56 that are formed isolated in the surface of the P-type substrate 50, on which the oxide film 53 is formed. On the oxide film 53, the conductive polysilicon line 74 is formed which is provided as a gate terminal (reference numeral 57 in FIGS. 3A and 8A) of the output transistor 46. The conductive polysilicon line 74 is formed extending up to the n-region 51 of the photodiode 33a as shown in FIG. 10, and connected to the n-region 51 through the via-contact 73b.

Connection is provided between the source 55 of the output transistor 46 and the power line 63 through the via-contact 73a while connection is provided between the drain 56 of the output transistor 46 and the metal line 72 shown in FIG. 10 through the via-contact 73de.

In the MOS image sensor 30 thus structured, when a reset signal is outputted from the control-pulse generating circuit 34 onto the reset line 60, the reset signal is applied to the gate terminal of the reset transistor 45. Meanwhile, when a row-select signal is outputted from the control-pulse generating circuit 34 onto the row-select line 61, the row-select signal is applied to the gate terminal of the row-select transistor 47.

Likewise, the power voltage Vcc, supplied from the not-shown power source for the MOS image sensor 30 onto the power line 63, is supplied to the respective source terminals (power terminal 44a, see FIG. 2A) of reset and output transistors 45, 46 of the signal-read circuit, to output an output signal of the output transistor 46 onto the output signal line 64.

Incidentally, FIG. 10 showed the case the signal-read circuit is in a three-transistor structure. Instead, for the four-transistor structure, the FIG. 10 structure is added with an arrangement that conductive-polysilicon global lines are laid horizontally for reset, row-select and row-read lines wherein connection is provided between the row-read line and the gate terminal of the row-read transistor 48 shown in FIG. 2B by a conductive polysilicon line.

The first and second embodiments used the conductive polysilicon film as global lines. Alternatively, silicide, salicide or the like may be used in place of the conductive polysilicon.

As discussed so far, the first and second embodiments provide the following effects.

(1) Because incident light in part is prevented from reflecting upon the metal-line layer into stray light and entering the adjacent pixel, there encounters no mixture of colors or color-reproducibility deterioration thus enabling imaging with quality.

(2) Because the microlens is to be provided closer to the photodiode, light is not collected front of focus by the microlens.

(3) because the lower-level global line is planarized, patterning accuracy is improved for the signal line, the color filter, the microlens, etc. formed thereon thus improving yield and facilitating miniaturization.

(4) Because the number of contacts reduces within the unit pixel, the photodiode is not suppressed in its area, which is suited for sensitivity improvement and pixel miniaturization.

Figure 15:
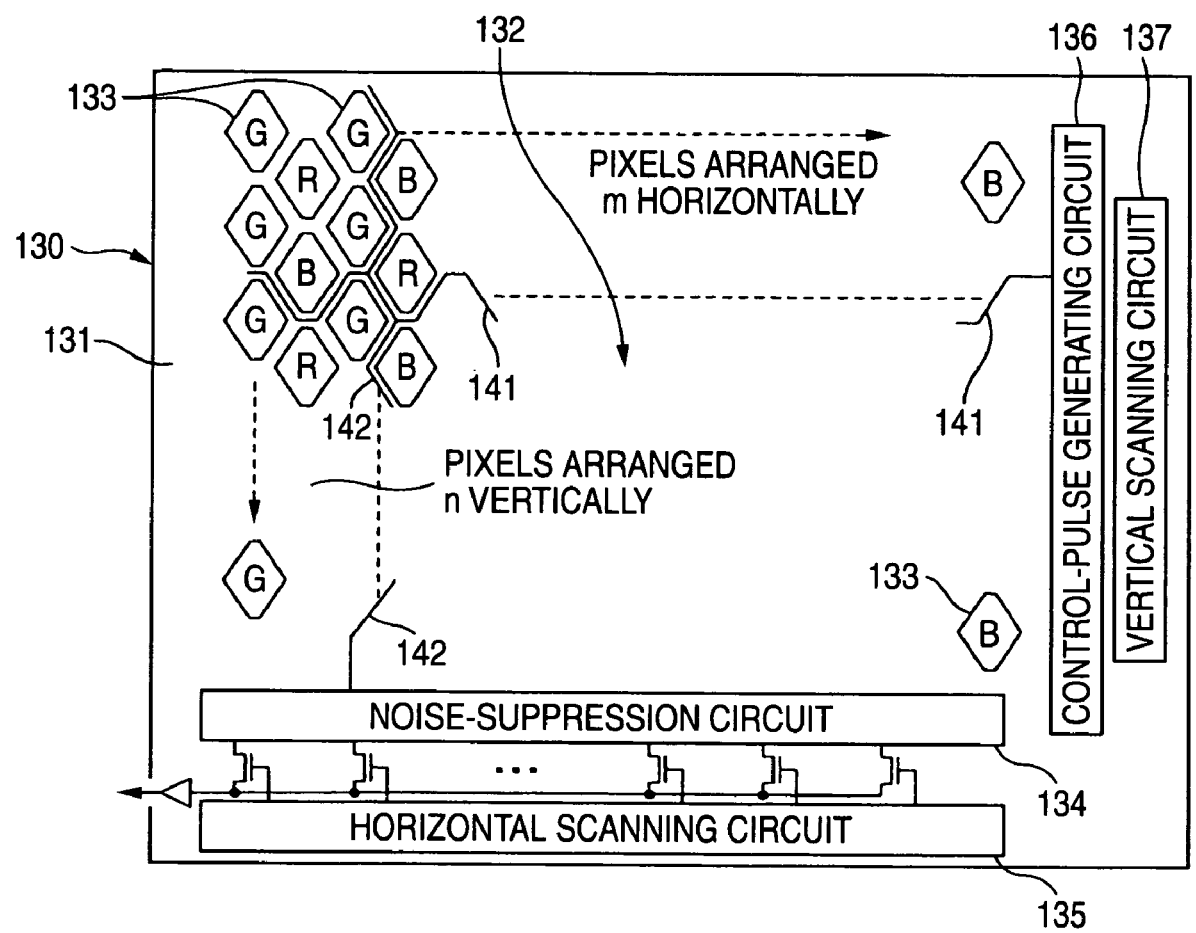
FIG. 15 is a typical surface view of a MOS image sensor in a honeycomb arrangement according to the third embodiment of the present invention.

FIG. 15 is a typical surface view of a MOS image sensor 30 in a honeycomb arrangement to be mounted on a digital camera, according to a third embodiment of the present invention. The CMOS image sensor 130 illustrated is formed with a multiplicity of unit pixels 133 in a matrix form, in an image area of a semiconductor substrate 131. In the CMOS image sensor 130 in this embodiment, the unit pixels 133 on the even row are formed deviated a ½ pitch relative to the unit pixels on the odd row. In the lower side region of the semiconductor substrate 131, there are formed a noise-suppression circuit 134 and a horizontal scanning circuit 135. In the right side region of the semiconductor substrate 131, there are formed a control-pulse generating circuit 136 and a vertical scanning circuit 137.

The unit pixels 133 are each configured with a photodiode 133a (see FIG. 2) and a signal-read circuit to read the optical signal detected by the photodiode 133a. Color filters are formed over the respective photodiodes 133a. In FIG. 15, a red filter is shown at "R", a green filter at "G" and a blue filter at "B".

Because the unit pixels 133 in the embodiment are in so-called a honeycomb arrangement, the horizontal (X-directional) global lines 141 (one only shown in FIG. 15), connected to the control-pulse circuit 136 and vertical scanning circuit 137, are each provided horizontally extending zigzag in a manner avoiding the photodiode in the image area 132. Likewise, the vertical (Y-directional) global lines 142 (one only shown in FIG. 15), connected to the noise-suppression circuit 134 and horizontal scanning circuit 135, are each provided vertically extending zigzag.

As well as in the first embodiment, the global lines 141, 142 laid over the image area 132 are connected to the signal-read circuits, at terminals 144a, 145a, 146a, 147a, 148a thereof. Accordingly, although FIG. 15 showed respective ones of horizontal and vertical global lines 141, 142 only, two or three global lines are actually laid between the adjacent ones of unit pixels 133. The explanation for the global lines in this embodiment is same as that made in the first embodiment. There encounters less problem if the global line is provided, as in this embodiment, longer an amount corresponding to the zigzag form (nearly √2 times) as compared to the FIG. 13A image sensor.

Therefore, the present embodiment forms the control signal line of conductive polysilicon instead of metal while forming the power and output-signal lines by metal films, such as of aluminum or copper, as in the related art.

Figure 16A:
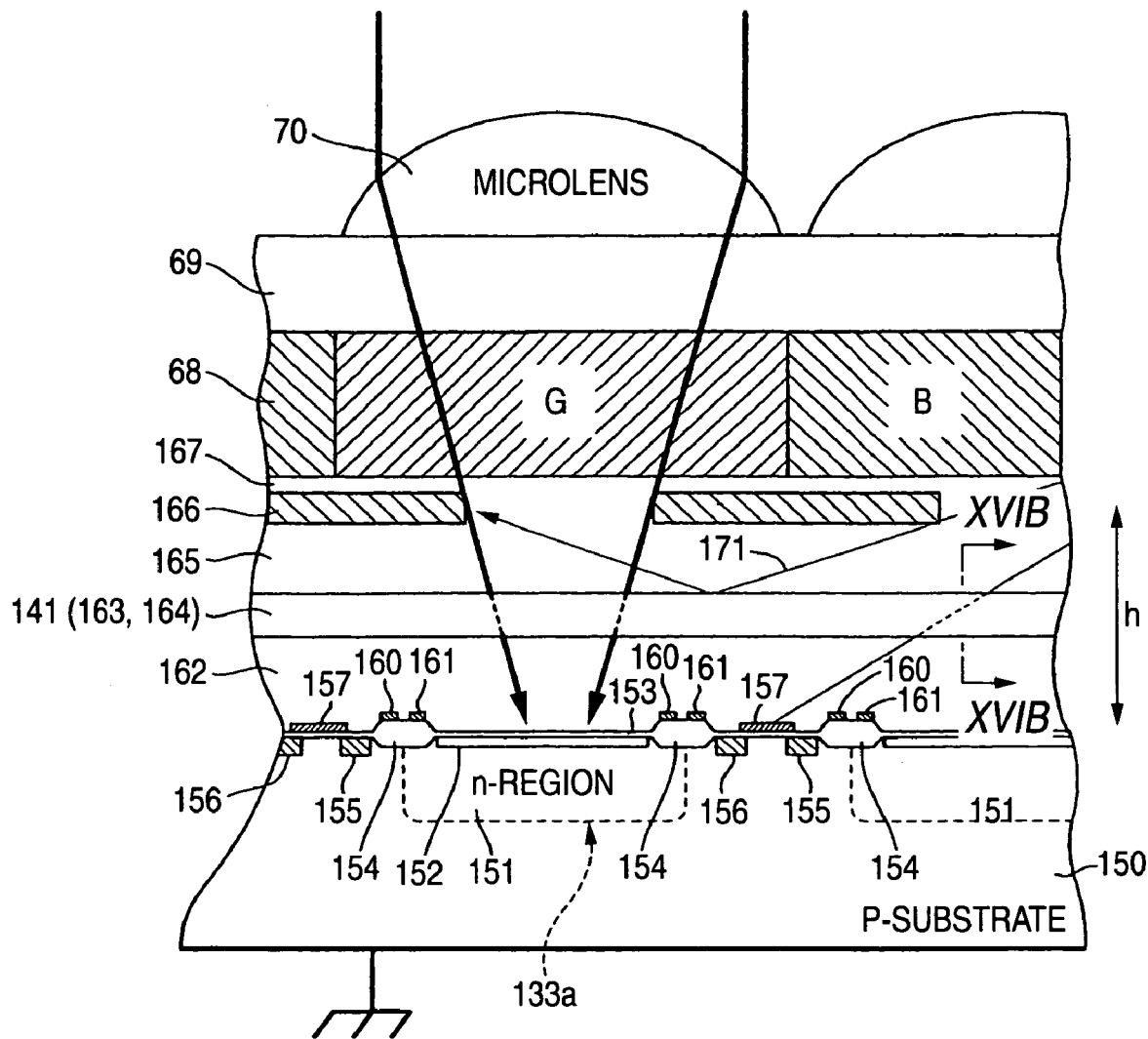
FIG. 16 is a typical sectional view of the MOS image sensor in FIG. 15, in a part covering nearly two pixels.
Figure 16B:
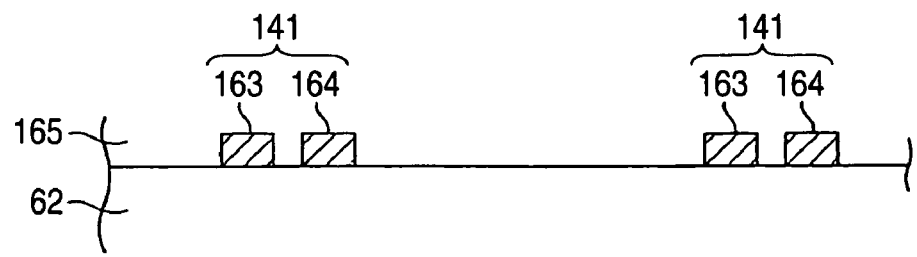

FIG. 16A is a typical sectional view showing the MOS image sensor shown in FIG. 15, in a part covering nearly two pixels thereof. FIG. 16B is a typical sectional view taken along line XVIB-XVIB in FIG. 16A. In the MOS image sensor of this embodiment, a PN junction (photodiode) 133a is formed by forming an n-region 151 in a surface of a P-type semiconductor substrate 150. In the surface of the n-region 51, a surface $P^+$ layer 152 is formed which is effective in reducing so-called "white injury" appearing on the image screen. An oxide film 153 is formed in the extreme surface.

A device-isolation region 154 is formed by forming thick an oxide film 153 in a boundary portion of between the photodiode 133a (151) and the signal-read-circuit formed region. In the signal-read-circuit formed region, formed are a source 155 and a drain 156 for the MOS transistor. On the oxide film 153, a gate electrode 157 is provided. The global lines 160, 161 are laid on the device-isolation region 154 in order to prevent the voltage fluctuations on the global line 160, 161 from being exerted to the substrate 150. There are various methods for forming a device-isolation region 154, i.e. LOCOS or recess-LOCOS technique, trench isolation (STI), high-concentration-boron-ion implant technique are usable.

In this embodiment, conductive polysilicon films 160, 161 are laid on a surface of the device-isolation region 154, to form two global lines. The conductive polysilicon films 160, 161 are respectively used as a rest line and a row-select line, say, for a three-transistor structure (FIG. 2A).

A gate electrode 157 and a conductive polysilicon film 160, 161 are formed over the oxide film 153 and device-isolation region 154, over which an interlayer insulation film 162 is formed and then planarized, on which global lines 163, 164 are formed of metal, such as aluminum. The metal lines 163, 164 are respectively used as power and output-signal lines, say, for a three-transistor structure.

After forming the metal lines 163, 164, an interlayer insulation film 165 is formed and planarized, on which a shade film 166 is formed of metal that shades the metal lines 163, 164 and signal-read circuit. On the shade film 166, an interlayer insulation film 67 is formed and planatized, on which a color-filter layer 68 is formed, on which an interlayer insulation film 69 is formed to form thereon a microlens 70.

Comparing with the related-art structure in FIG. 14B, the present embodiment is also eliminated of the necessity for the interlayer insulation film 23 and metal layer 10 provided over the gate electrode 22, thus being reduced in thickness h correspondingly.

In this manner, the present embodiment uses global lines of conductive polysilicon lower in reflectivity than metal, thus reducing the number of the metal lines causing a multi-reflection of stray portion 171 of the incident light. Moreover, because the multi-level structure formed on the semiconductor substrate 150 can be reduced in thickness h, the color filter 68 and the microlens 70 can be provided closer to the image area (photodiode), to facilitate focus control in forming the microlens 70. Thus, the MOS image sensor in this embodiment is allowed to take an image with quality.

A magnification view in a part of the global lines 160, 161 formed of low-reflective conductive polysilicon shown in FIG. 16A is also shown in FIG. 4A, and the explanation thereof is same as that made in the first embodiment. In addition, the structure shown in FIGS. 4B, 5A, 5B, 6A and 6B can be applied in this third embodiment.

Figure 17:
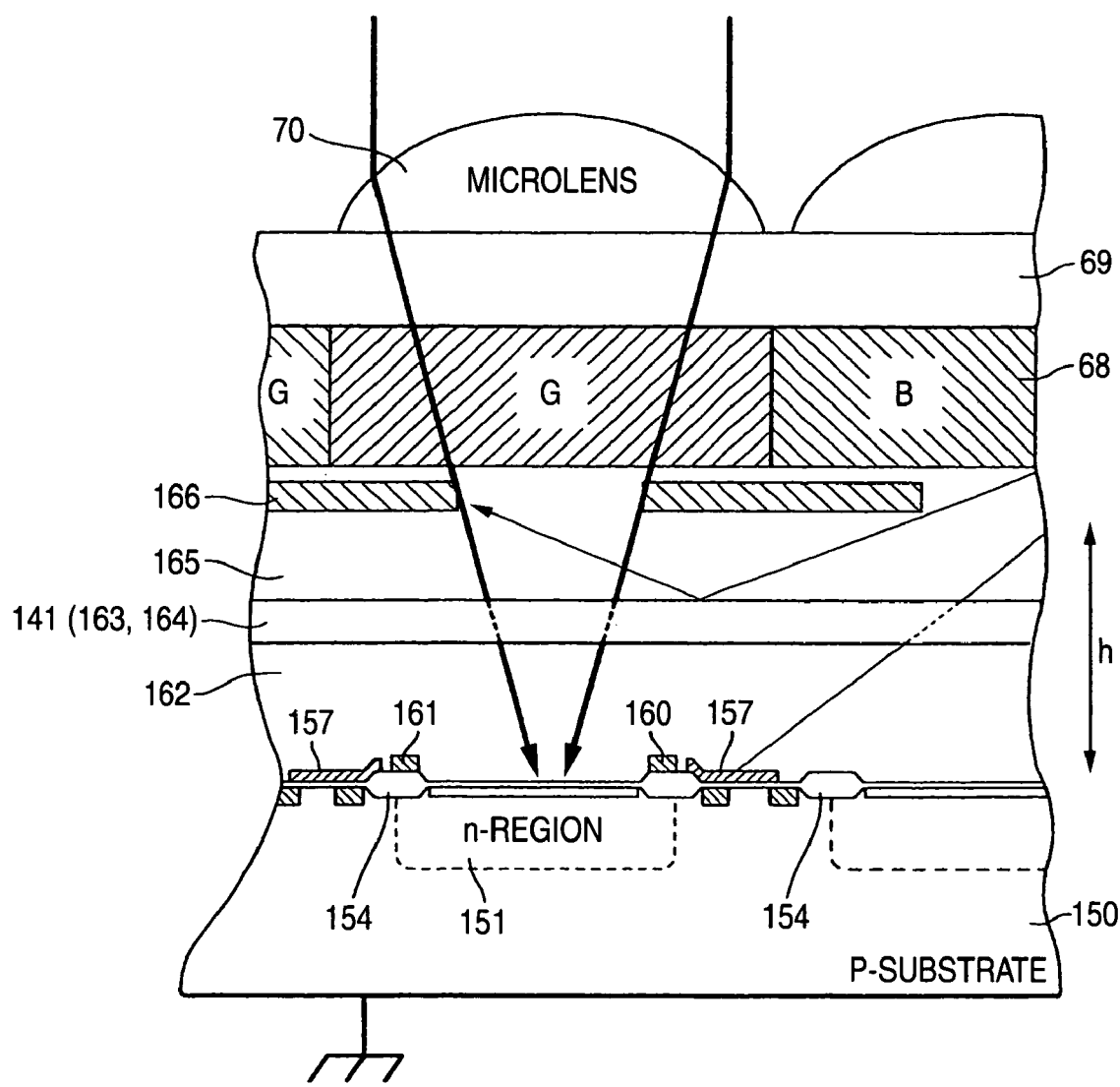
FIG. 17 is a typical sectional view taken in a position different from FIG. 16.

FIG. 17 is a typical sectional view of the MOS image sensor shown in FIG. 15 in a part covering nearly two pixels, which is different from FIG. 16 only in the sectional position taken. Although FIG. 16 shows the section taken in a position where isolation is provided between the MOS transistor gate electrode 157 and the global line, FIG. 17 illustrates a section taken in a position where the gate electrode 157 is formed continuous (connected) with the global line.

Figure 18:
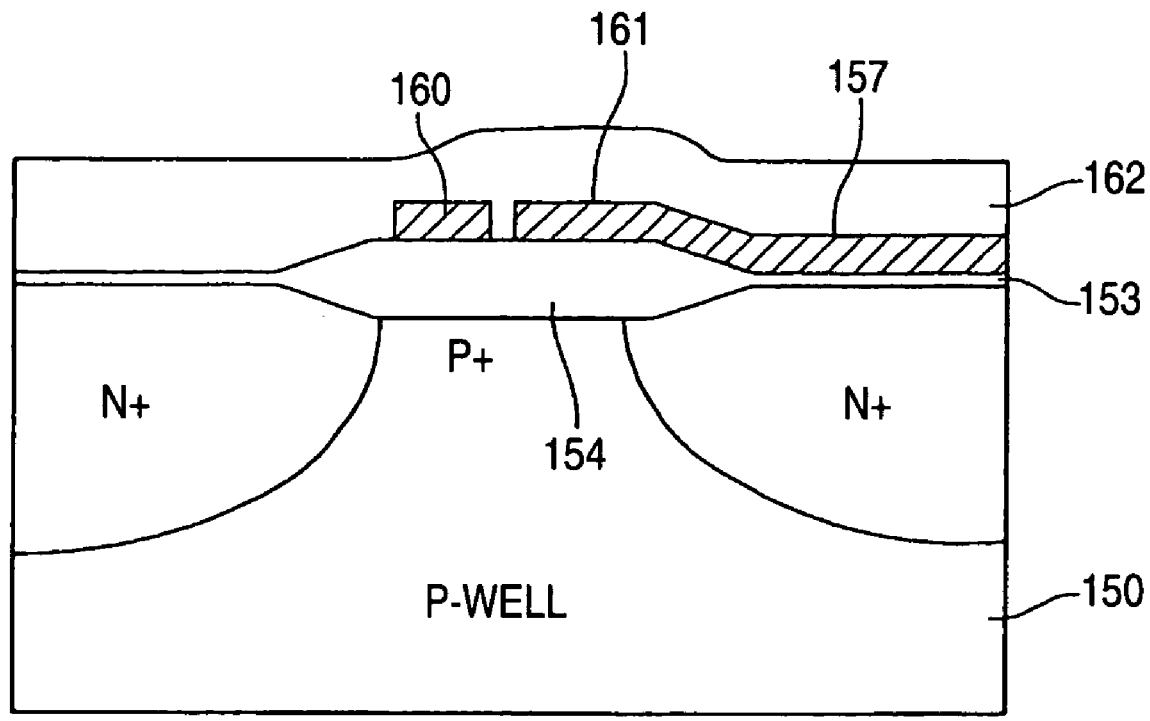
FIG. 18 is an essential-part magnification view of FIG. 17.

FIG. 18 is an essential-part magnification view of FIG. 17, showing that the global line 161 formed on the device-isolation region 154 is formed continuous with the gate electrode 157. In the related-art, the gate electrode 157 and the aluminum line 10 laid in the upper level are necessarily connected together through a contact hole 10a as shown in FIG. 9B, thus increasing the number of process steps. However, in case the global line 161 is formed by use of conductive polysilicon as in the present embodiment, a polysilicon film can be advantageously formed integral with the gate electrode 157 to be connected therewith. Meanwhile, the point the contact hole 10a is provided cannot be served for the image area, this embodiment is to broaden such a contact hole 10a is not needed.

Figure 19:
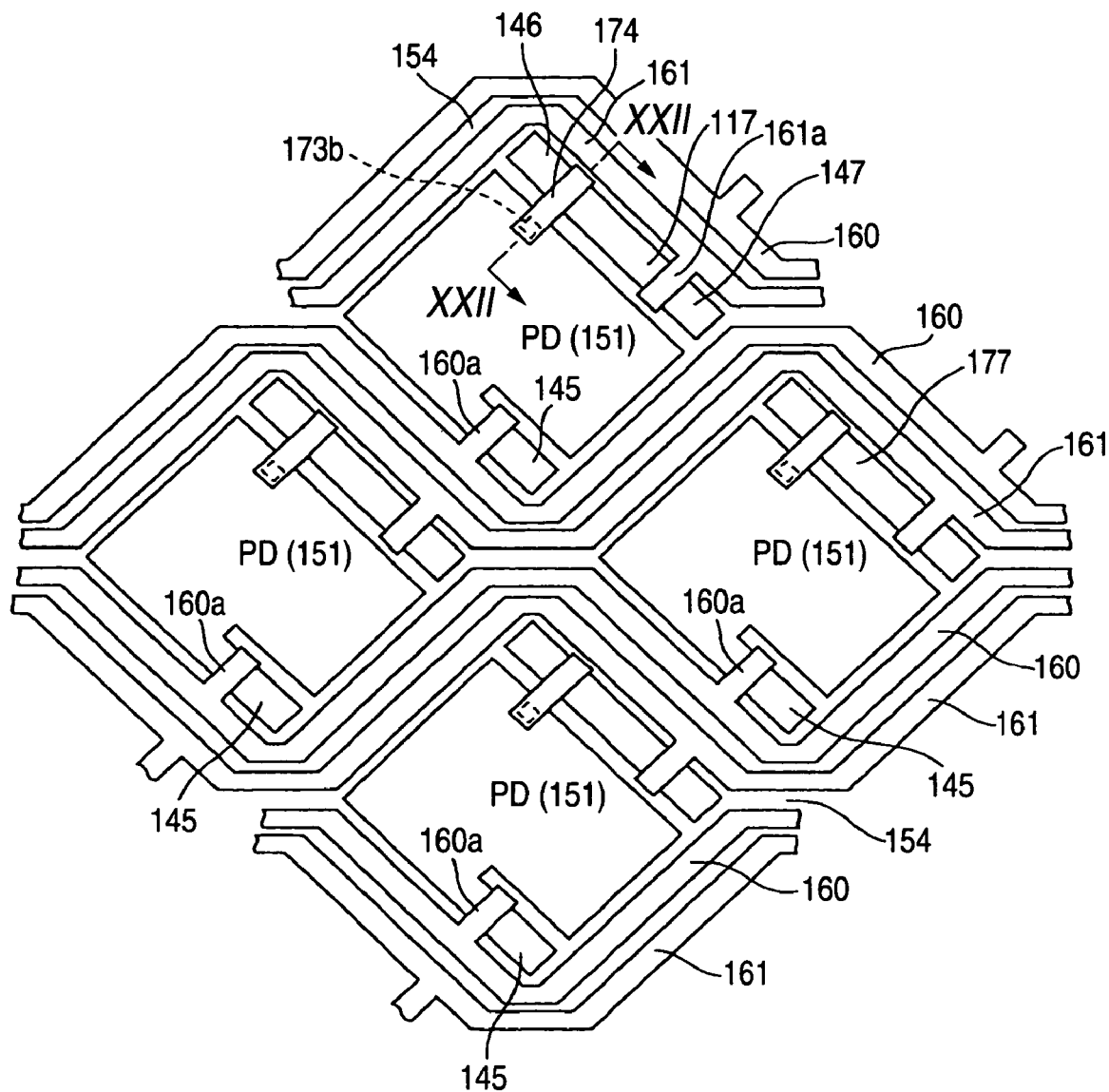
FIG. 19 is a wiring diagram showing a detail of lower-level global lines on the MOS image sensor in FIG. 15, in a part covering four photodiodes (image area)
Figure 20:
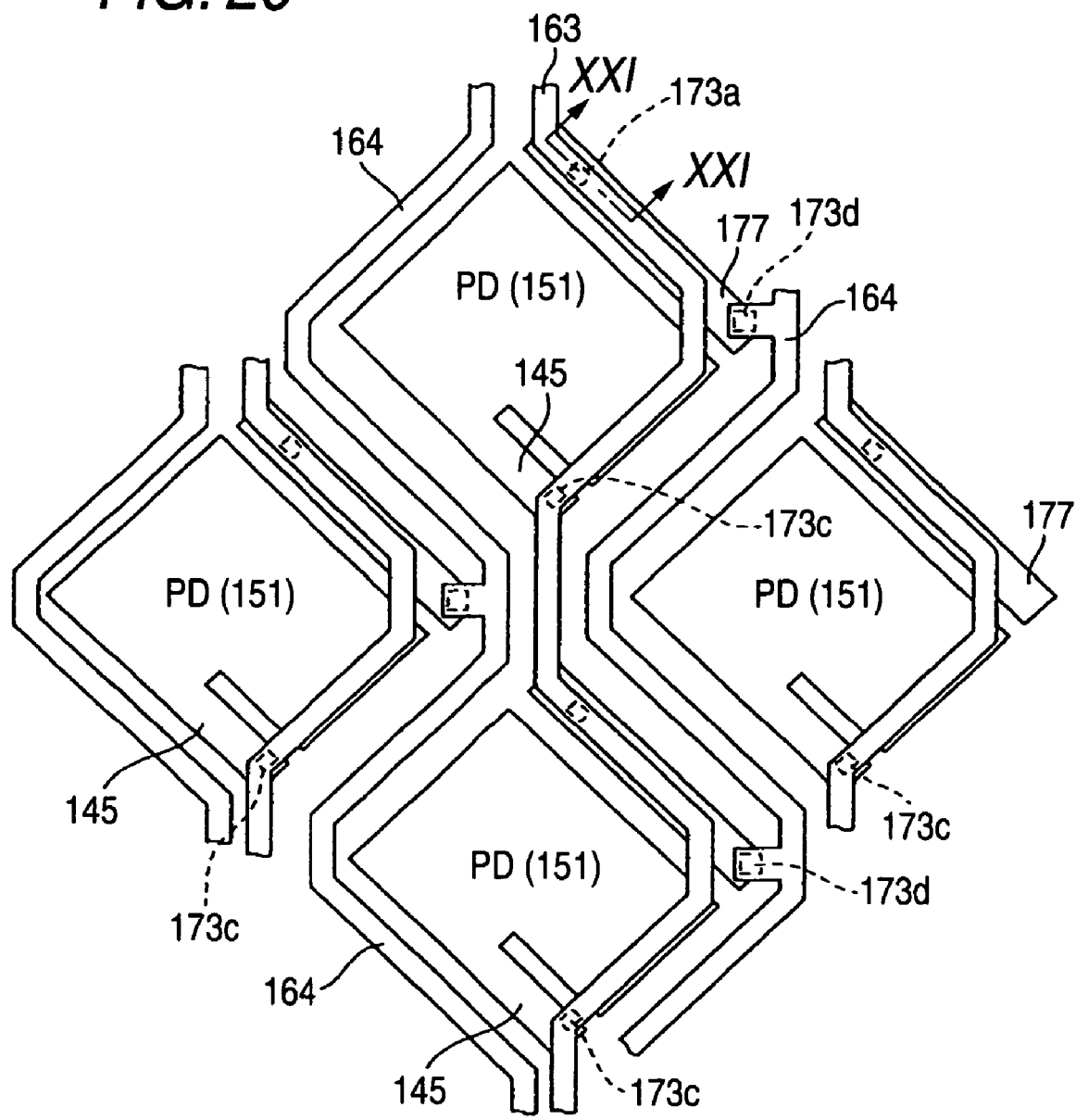
FIG. 20 is a wiring diagram showing a detail of upper-level global lines on the MOS image sensor in FIG. 15, in a part covering four photodiodes (image area)

FIGS. 19 and 20 are wiring diagrams showing the detail of the global lines of the MOS image sensor shown in FIG. 15 in a part at and around four photodiodes (image area). FIG. 19 shows four photodiodes (PDs) and underlying polysilicon global lines 160, 161 while FIG. 20 shows four photodiodes (PDs) and overlying polysilicon global lines 163, 164. In FIG. 20, the underlying global lines 160, 161 are omitted of showing because the underlying global lines 160, 161 if depicted makes the figure complicate.

In the upper right side of each of photodiodes (PD 151), a diffusion region 177 is formed. In the diffusion region 177, output and row-select transistors 146, 147 are formed connected in series. At the lower corner of the photodiode (PD 151), a reset transistor 145 is formed.

Between the photodiodes (PDs 151) and between the photodiode (PD 151) and the diffusion region 177, defining is made by the device-isolation region 154. Reset and row-select lines 160, 161 are laid as global lines of conductive polysilicon, on the device-isolation region 154 horizontally extending zigzag through between the photodiodes (PDs 151).

Meanwhile, power and output-signal lines 163, 164 are formed of metal through between the photodiodes (PDs 151) extending in the vertical direction orthogonal to the global lines 160, 161, through the planarized film 162 (see FIG. 16) relative to the reset and row-select lines 160, 161.

Figure 21:
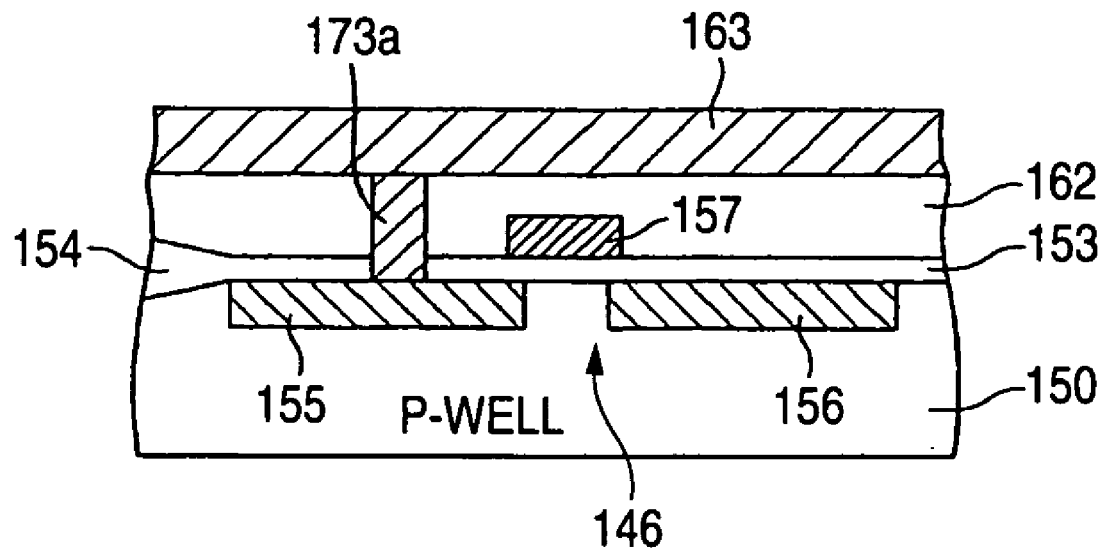
FIG. 21 is a typical sectional view taken along line XXI-XXI in FIG. 20.
Figure 22:
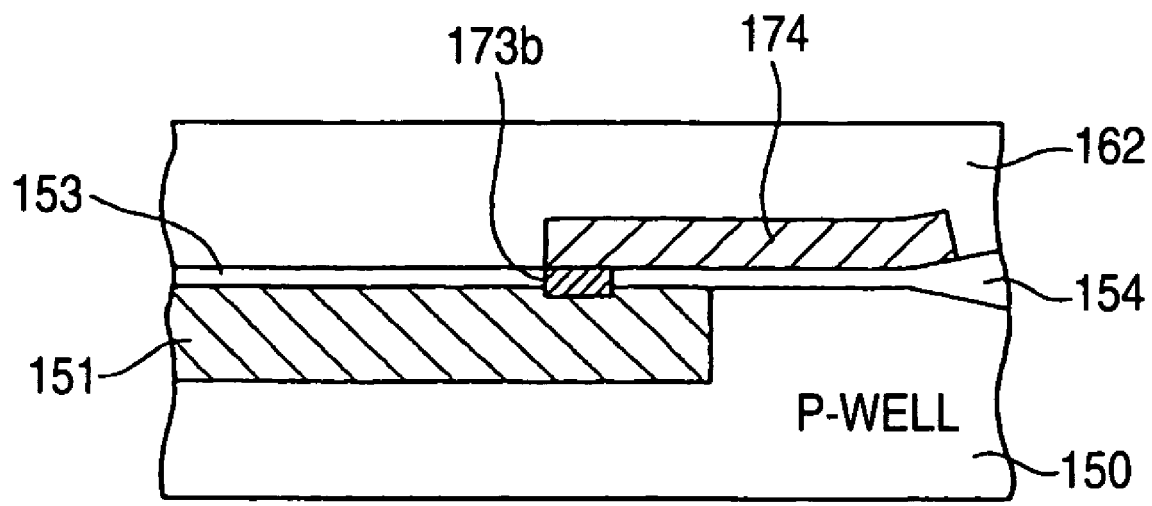
FIG. 22 is a typical sectional view taken along line XXII-XXII in FIG. 21.

FIG. 21 is a typical sectional view taken along XXI-XXI in FIG. 20, in a part covering the output transistor 146 formed in the region 177. Connection is provided between the source terminal 155 of the output transistor 146 and the upper-level global line (power line) 163 through a via-contact 173a. FIG. 22 is a typical sectional view taken along XXII-XXII in FIG. 19, in a part covering a connection of between the gate terminal of the output transistor 146 and the photodiode (PD 151). Connection is provided between the gate terminal of the output transistor 146 and the photodiode (PD 151) through a conductive polysilicon line 174 and via-contact 173b.

The source terminal of the FIG. 20 reset transistor 145 is connected to the power line 163 through a via-contact 173c, similarly to FIG. 21. The gate terminal of the reset transistor 145 is connected to the conductive polysilicon terminal 160a (FIG. 19) formed extending from the reset line 160. The drain of the reset transistor 145 is formed continuous with the n-region of the photo-transistor (PD 151)

The gate terminal of the row-select transistor 147, whose source is connected to the drain of the output transistor 146, is connected to the conductive polysilicon terminal 161a formed extending from the row-select line 161. The drain, i.e. the output terminal shown in FIG. 2A, is connected to the output signal line 164 through a via-contact 173d.

In the MOS image sensor 130 laid with the global lines 160, 161, 163, 164 thus structured, when a reset signal is outputted from the control-pulse generating circuit 136 onto the reset line 160, the reset signal is applied to the gate terminal of the reset transistor 145. Meanwhile, a row-select signal is outputted from the control-pulse generating circuit 136 to the row-select line 161, the row-select signal is applied to the gate terminal of the row-select transistor 147.

Likewise, the power voltage Vcc, supplied from the not-shown power source of the MOS image sensor 130 onto the power line 163, is supplied to the respective source terminals (power terminal 144a, see FIG. 2A) of the reset and output transistors 145, 146 of each signal-read circuit. The output transistor outputs an output signal onto the output signal line 164.

The vertical two global lines 163, 164 and the horizontal two global lines 160, 161 cross with each other, through the planarization film 162, at their intersections. In this embodiment, at the intersection, the horizontal global lines 160, 161 for adjacent pixels go near to each other while the vertical global lines 163, 164 similarly go near to each other, i.e. totally eight global lines are in crossing over (see FIG. 23).

Figure 13A:
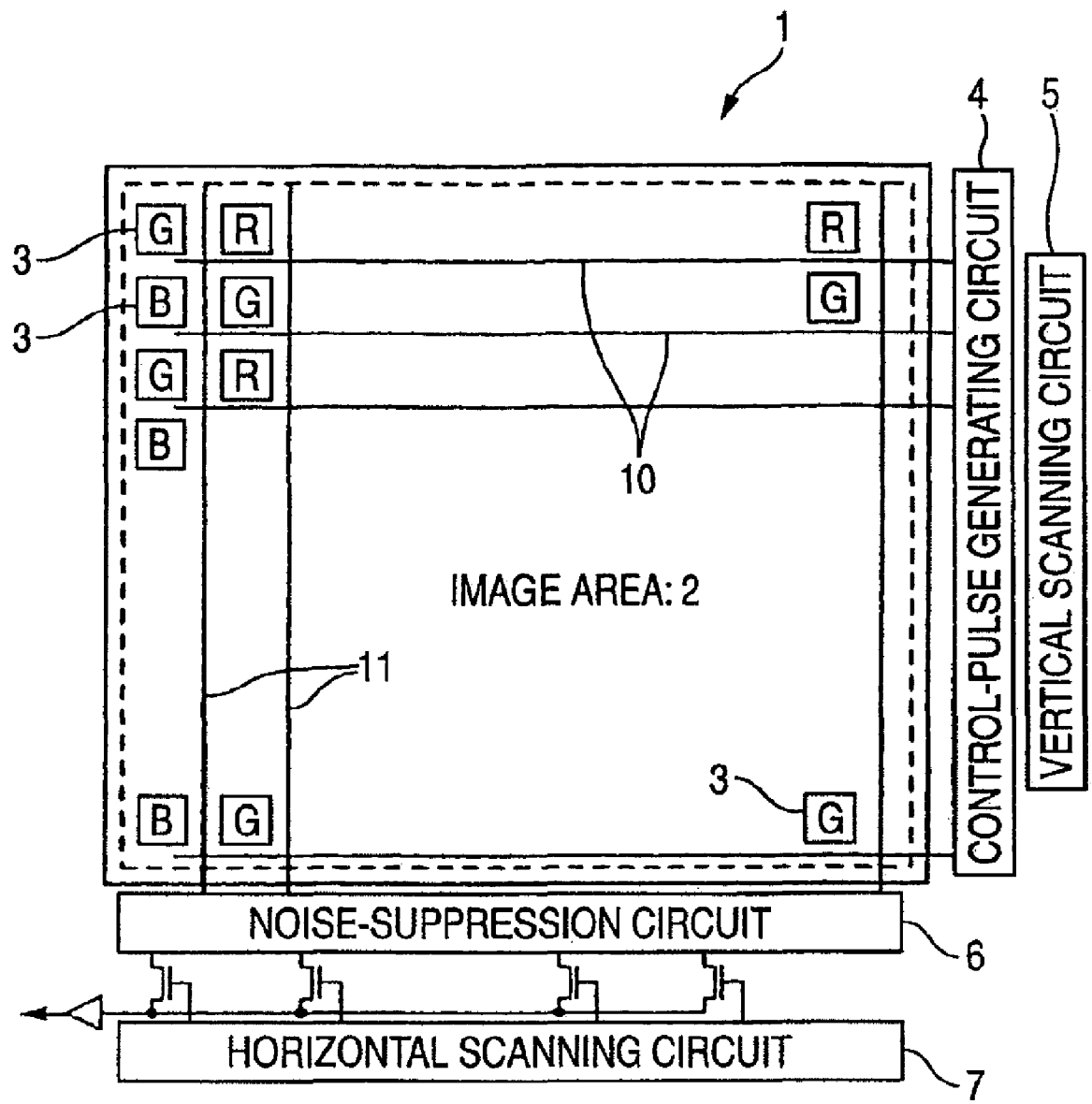
FIG. 13A is a typical surface view of the related-art MOS image sensor in a square lattice arrangement.
Figure 13B:
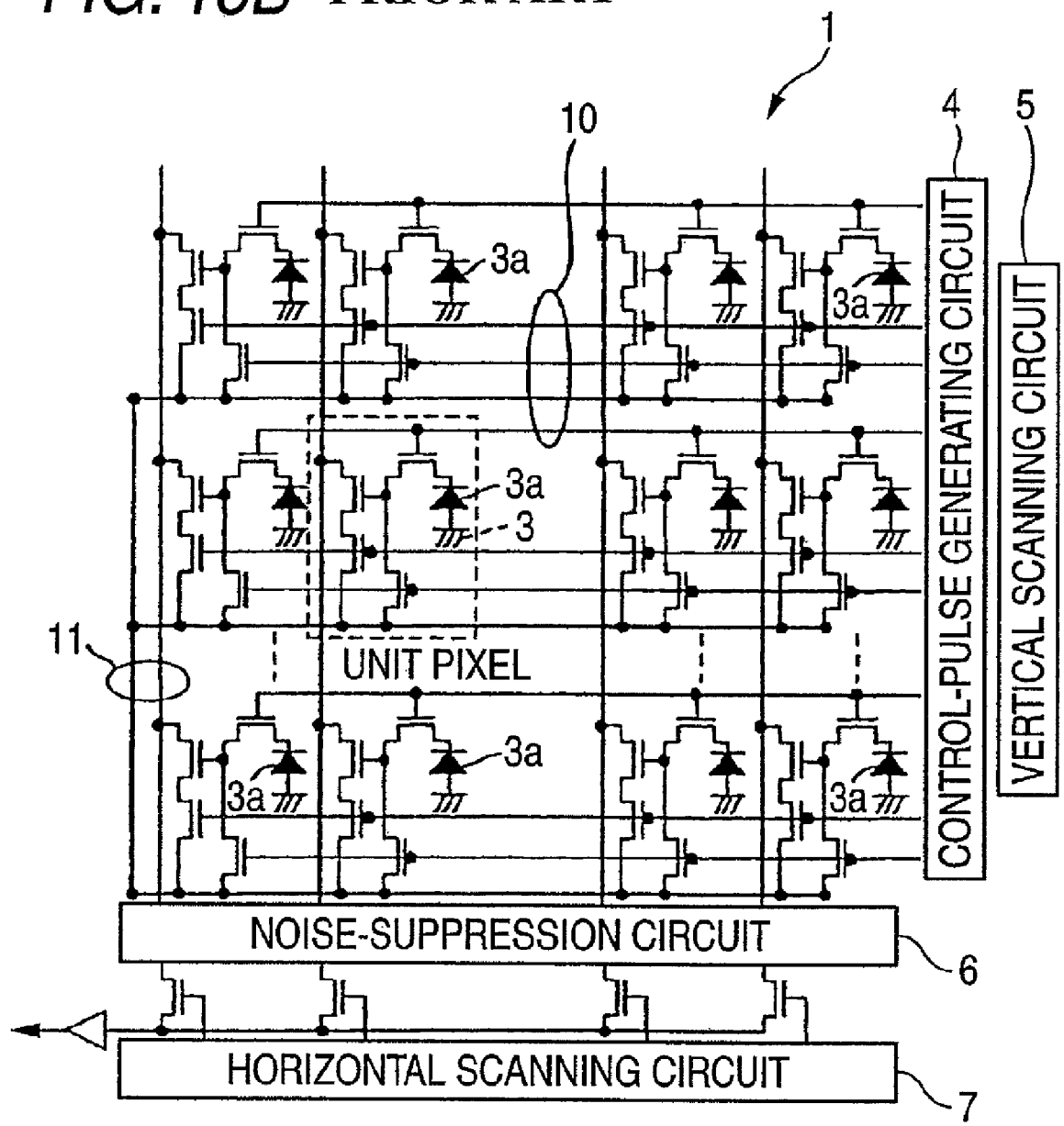
FIG. 13B is a circuit diagram of the related-art MOS image sensor shown in FIG. 13A.

On the contrary, in the MOS image sensor having a square lattice arrangement as shown in FIG. 13A, the vertical two global lines 11 (one only shown in the figure) and horizontal two global lines 10 (one only shown in the figure) cross over, totally four in the number, at the intersection.

In the MOS image sensor, the narrower the area where the global lines are laid the broader the image area can be set up. In case the number of crossover lines increases at the intersection as in the present embodiment, the efficiency of area improves correspondingly at the intersection. This provides a broader image area, thus allowing to take an image with lightness.

Incidentally, FIG. 19 showed the three-transistor structure of signal-read circuit. In the case of a four-transistor structure, the FIG. 19 structure is added with a structure that three conductive-polysilicon global lines, i.e. reset, row-select and row-read lines, are horizontally laid zigzag wherein connection is provided between the row-read line and the gate terminal of the FIG. 2B row-read transistor 148 by a conductive polysilicon line.

Figure 23:
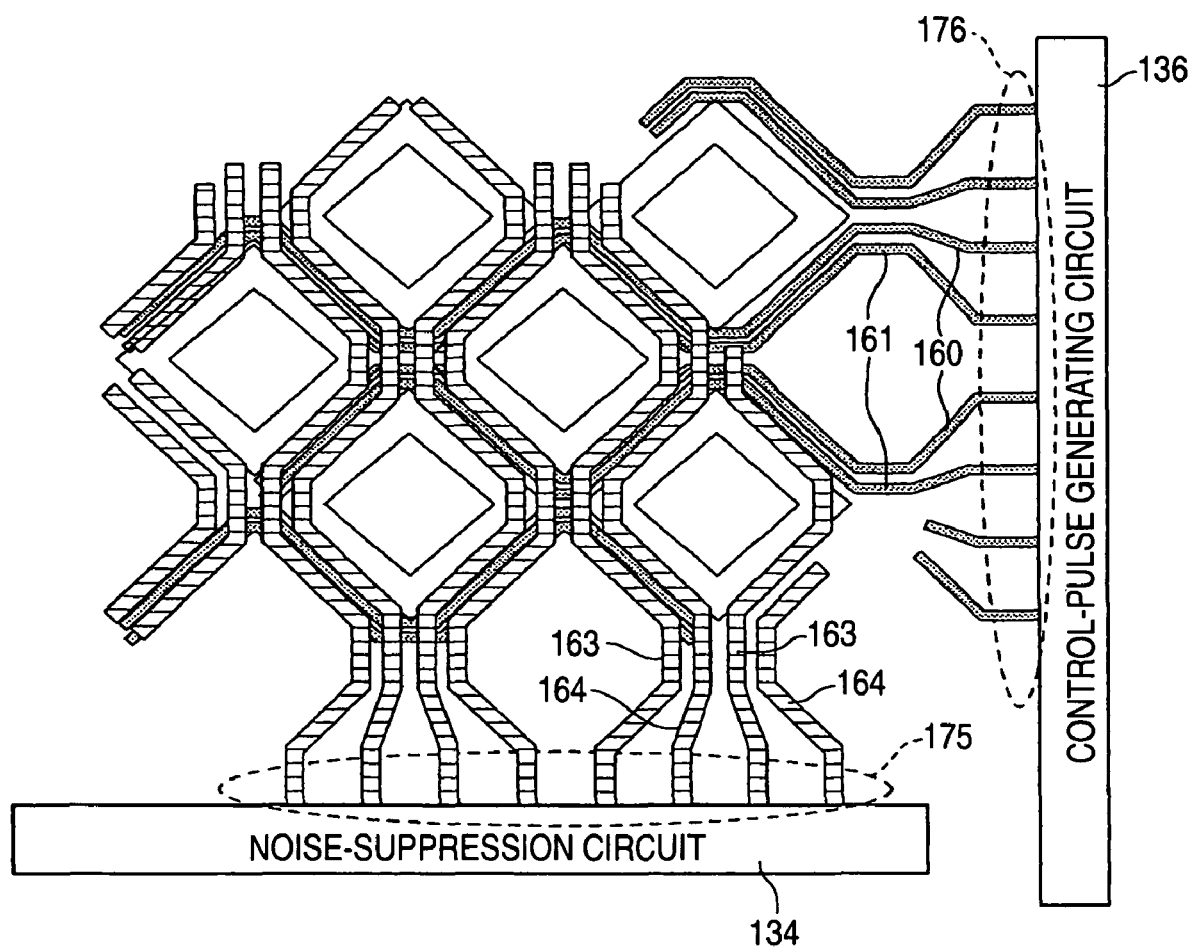
FIG. 23 is a typical view showing a connection between an end of the FIG. 15 global line and a scanning circuit.

FIG. 23 is a schematic view of a connection between the global lines and the control-pulse generating circuit 136 and noise-suppression circuit 134. Where the global lines are provided zigzag through between photodiodes (pixels), global lines in a group corresponding to adjacent pixels repeatedly come close to and away from each other, thus raising a problem that global lines are not given in a constant pitch in the layout thereof. This causes a disadvantage that the connections of the global lines to the peripheral circuits are not easy to fabricate.

Therefore, as shown in FIG. 23, this embodiment arranges the global lines into a constant pitch at the connections 175, 176 of the ends of the global lines, and connects those with the circuits 134, 136. This facilitates the connection between the global lines and the peripheral circuits.

Incidentally, although the embodiment in FIG. 16, provided the shade film 166 in a plate form in the level lower than the color-filter layer 68, it can be provided in a form covering the metal lines 163, 164. Furthermore, another shade film can be provided covering between the device-isolation regions 154 sandwiching the MOS transistor.

Meanwhile, the third embodiment used polysilicon in the global lines. Alternatively, silicide, salicide or the like may be employed in place of polysilicon.

As discussed so far, the third embodiment provides the following effects.
  (1) A CMOS image sensor having a honeycomb arrangement is easy to form.
  (2) The signal processing circuit used in a honeycomb CCD can be applied.
  (3) It can be prevented that part of incident light reflects upon the metal-line layer into stray light that enters the adjacent pixel. This eliminates the mixture of colors and the deterioration in color reproducibility, making it possible to take an image with quality.

(4) Because the microlens can be provided closer to the photodiode, light is not collected front focus by the microlens even where pixels are miniaturized.

(5) Because the lower-level global lines are planarized, patterning is improved for the overlying signal line, color filter, microlens, etc., thus improving yield and facilitating miniaturization.

(6) Because the number of contacts reduces within the unit pixel, the photodiode is not suppressed in area. Sensitivity improvement and pixel miniaturization are suitably applied.

The MOS image sensor in the invention is to suppress the image-quality deterioration by the reflection of incident light upon the metal line, hence being useful as a MOS image sensor to be mounted on a digital camera for taking a quality image.

The MOS image sensor in the invention can be applied with a honeycomb arrangement having a broad image area and suppress the deterioration of image quality as caused by a reflection of incident light upon metal lines, hence being useful as a MOS image sensor to be mounted on a digital The entire disclosure of each and every foreign patent application from which the benefit of foreign priority has been claimed in the present application is incorporated herein by reference, as if fully set forth.

What is claimed is:

1. A MOS image sensor comprising:
a semiconductor substrate that has a surface including an image area;
a plurality of photoelectric conversion elements arranged on the image area; and
lines formed over the image area on a device-isolation region that isolates between the photoelectric conversion elements and connected to a signal-read circuit provided corresponding to each of the photoelectric conversion elements, wherein a predetermined one of the lines is formed by a conductive polysilicon film.

2. A MOS image sensor according to claim 1, wherein the predetermined line is a control signal line.

3. A MOS image sensor according to claim 2, wherein the control signal line comprises reset and row-select lines for the signal-read circuit in a three-transistor structure, or comprises reset, row-select and row-read lines for the signal-read circuit in a four-transistor structure.

4. A MOS image sensor according to claim 1, wherein, other lines than the predetermined line comprise power and output-signal lines each formed by a metal line.

5. A MOS image sensor according to claim 4, wherein a surface of the metal line is coated with a low-reflective material.

6. A MOS image sensor according to claim 5, wherein the low-reflective material includes at least one of polysilicon, silicon nitride, tungsten, alumina, color resist, surface-scatter porous material and light-absorbing material.

7. A MOS image sensor according to claim 1, wherein, when the predetermined line is formed in plurality and adjacent one to another, interlayer insulation between the lines is provided by an oxide film formed on a surface of the conductive polysilicon film.

8. A MOS image sensor according to claim 1, wherein the signal-read circuit is configured with a MOS transistor having a gate electrode formed integral with the predetermined line.

9. A MOS image sensor according to claim 1, wherein said plurality of photoelectric conversion elements are arranged in a square lattice form.

10. A MOS image sensor according to claim 1,
wherein said plurality of photoelectric conversion elements are arranged in a matrix form, and
those of the photoelectric conversion elements on an odd row are deviated a half pitch relative to those of the photoelectric conversion element on an even row.

11. A MOS image sensor according to claim 10,
wherein the lines are formed horizontally or vertically so as to zigzag in a manner avoiding the photoelectric conversion elements, and
the lines are formed equal in pitch in a part of the lines connected to a required circuit provided in a periphery of the image area.

12. A manufacturing method for a MOS image sensor according to claim 1, the method comprising:
forming a first conductive polysilicon film in a first level;
patterning the first conductive polysilicon film into a wiring form;
forming an insulation film on a surface of the first conductive polysilicon film patterned in a wiring form;
forming a second conductive polysilicon film in a second level over the insulation film; and
patterning the second conductive polysilicon film into a wiring form, so as to form a plurality of the predetermined lines adjacent one to another.

13. A manufacturing method according to claim 12, wherein the second conductive polysilicon film formed is planarized by CMP in a portion overlapping with the first conductive polysilicon film when viewed from a normal direction of the semiconductor substrate, and then the second conductive polysilicon film is patterned.

14. A digital camera comprising a MOS image sensor according to claim 1.

15. A MOS image sensor comprising:
a semiconductor substrate that has a surface including an image area;
a plurality of photoelectric conversion elements arranged on the image area; and
lines formed over the image area on a device-isolation region that isolates between the photoelectric conversion element and connected to a signal-read circuit provided corresponding to each of the photoelectric conversion elements, wherein a predetermined one of the lines is formed by silicide or salicide.

16. A manufacturing method for a MOS image sensor according to claim 15, the method comprising:
forming a first silicide or salicide film in a first level;
patterning the first silicide or salicide film into a wiring form;
forming an insulation film on a surface of the first silicide or salicide film patterned in a wiring form;
forming a second silicide or salicide film in a second level over the insulation film; and
patterning the second silicide or salicide film into a wiring form, so as to form a plurality of the predetermined lines adjacent one to another.

17. A digital camera comprising a MOS image sensor according to claim 15.

* * * * *